US012791648B2

(12) United States Patent
Srivastava et al.

(10) Patent No.: US 12,791,648 B2
(45) Date of Patent: Nov. 10, 2026

(54) ELECTROMAGNETIC INTERFERENCE SUPPRESSION TECHNIQUES FOR MAGNETIC RESONANCE IMAGING

(71) Applicant: Hyperfine Operations, Inc., Guilford, CT (US)

(72) Inventors: Deepansh Srivastava, Guilford, CT (US); Dingtian Zhang, Guilford, CT (US)

(73) Assignee: Hyperfine Operations, Inc., Guilford, CT (US)

( * ) Notice: Subject to any disclaimer, the term of this patent is extended or adjusted under 35 U.S.C. 154(b) by 39 days.

(21) Appl. No.: 18/979,434

(22) Filed: Dec. 12, 2024

(65) Prior Publication Data

US 2025/0110196 A1 Apr. 3, 2025

Related U.S. Application Data

(63) Continuation of application No. PCT/US2023/068306, filed on Jun. 12, 2023.

(60) Provisional application No. 63/351,710, filed on Jun. 13, 2022.

(51) Int. Cl.
*G01R 33/565* (2006.01)

(52) U.S. Cl.
CPC ................................ *G01R 33/5659* (2013.01)

(58) Field of Classification Search
None
See application file for complete search history.

(56) References Cited

U.S. PATENT DOCUMENTS

| | | | | |
|---|---|---|---|---|
| 12,189,012 | B2 * | 1/2025 | Wald | A61B 5/055 |
| 2005/0248347 | A1 | 11/2005 | Damadian | |
| 2015/0005618 | A1 | 1/2015 | Dumoulin | |
| 2015/0226817 | A1 | 8/2015 | Pourrahimi | |
| 2016/0169993 | A1 * | 6/2016 | Rearick | G01R 33/3802 324/309 |
| 2020/0033431 | A1 | 1/2020 | Schlemper et al. | |
| 2020/0249292 | A1 | 8/2020 | Biber et al. | |

(Continued)

FOREIGN PATENT DOCUMENTS

| | | | | |
|---|---|---|---|---|
| EP | 4653904 | A1 * | 11/2025 | G01R 33/5617 |

OTHER PUBLICATIONS

International Search Report and Written Opinion from PCT/US23/68306 dated Nov. 17, 2023.

*Primary Examiner* — Richard Isla
(74) *Attorney, Agent, or Firm* — Foley & Lardner LLP

(57) ABSTRACT

Systems and methods for suppressing electromagnetic interference (EMI) in magnetic resonance (MR) data are provided. The systems and methods include identifying a first subset of the MR data that is affected by EMI and suppressing EMI in the first subset to obtain a second subset of the MR data. Suppressing EMI in the first subset is performed by: applying a filter to the first subset of the MR data in order to suppress contribution of MR spin echo signals in the first subset of the MR data thereby obtaining signal-suppressed MR data; suppressing EMI in the signal-suppressed MR data to obtain EMI-suppressed MR data; and applying an inverse of the filter to the EMI-suppressed MR data to obtain the second subset of the MR data. The systems and methods include generating an MR image using the second subset of the MR data and outputting the generated MR image.

15 Claims, 19 Drawing Sheets

(56) References Cited

U.S. PATENT DOCUMENTS

| | | | |
|---|---|---|---|
| 2020/0355761 | A1 | 11/2020 | Mcnulty et al. |
| 2021/0208227 | A1 | 7/2021 | Hardy et al. |
| 2022/0354378 | A1 | 11/2022 | Nacev et al. |
| 2024/0168105 | A1 | 5/2024 | Inglis et al. |

* cited by examiner

400

```
EMI_index = [0]
402 while EMI_index != []:
404     EMI_index = get_EMI_index_from_edge_of_k_space()
406     for n in EMI_index:
```

406a $a_n = y_n + \frac{1}{4}[\,(y_{n-1} + y_{n+1}) - (y_{n-2} + y_{n+2})\,]$

406b $U, S, V = SVD(a_n)$

406c $S[0] = 0$

406d $a'_n = USV^T$

406e $y_n = a'_n - \frac{1}{4}[\,(y_{n-1} + y_{n+1}) - (y_{n-2} + y_{n+2})\,]$

FIG. 4

ELECTROMAGNETIC INTERFERENCE SUPPRESSION TECHNIQUES FOR MAGNETIC RESONANCE IMAGING

CROSS-REFERENCE TO RELATED APPLICATION

This application claims the benefit under 35 U.S.C. § 120 as a continuation of PCT Patent Application No. PCT/US2023/068306, filed on Jun. 12, 2023, which claims benefit under 35 U.S.C. § 119 (c) to U.S. Provisional Patent Application No. 63/351,710, filed on Jun. 13, 2022, the entire contents of which are incorporated herein by reference.

BACKGROUND

Magnetic resonance imaging (MRI) provides an important imaging modality for numerous applications and is widely utilized in clinical and research settings to produce images of the inside of the human body. As a generality, MRI is based on detecting magnetic resonance (MR) signals, which are electromagnetic waves emitted by atoms in response to state changes resulting from applied electromagnetic fields. For example, nuclear magnetic resonance (NMR) techniques involve detecting MR signals emitted from the nuclei of excited atoms upon the re-alignment or relaxation of the nuclear spin of atoms in an object being imaged (e.g., atoms in the tissue of the human body). Detected MR signals may be processed to produce images, which in the context of medical applications, allows for the investigation of internal structures and/or biological processes within the body for diagnostic, therapeutic and/or research purposes.

SUMMARY

Some embodiments provide for a method for suppressing electromagnetic interference (EMI) in magnetic resonance (MR) data obtained by a magnetic resonance imaging (MRI) system. The method comprises using at least one computer hardware processor to perform: identifying a first subset of the MR data that is affected by EMI; suppressing EMI in the first subset of the MR data to obtain a second subset of the MR data by: applying a filter to the first subset of the MR data in order to suppress contribution of MR spin echo signals in the first subset of the MR data thereby obtaining signal-suppressed MR data; suppressing EMI in the signal-suppressed MR data to obtain EMI-suppressed MR data; and applying an inverse of the filter to the EMI-suppressed MR data to obtain the second subset of the MR data; generating an MR image using the second subset of the MR data; and outputting the generated MR image.

In some embodiments, suppressing the EMI in the signal-suppressed MR data comprises using component decomposition to obtain the EMI-suppressed MR data.

In some embodiments, the first subset of the MR data comprises a plurality of data portions for a respective plurality of frequency or time bins, and wherein suppressing the EMI in the first subset of the MR data comprises: for each particular data portion in the plurality of data portions, applying the filter to the particular data portion to obtain a respective signal-suppressed MR data portion; suppressing EMI in the respective signal-suppressed MR data portion to obtain a respective EMI-suppressed MR data portion; and applying the inverse of the filter to the EMI-suppressed MR data portion.

In some embodiments, suppressing EMI in the respective signal-suppressed MR data portion comprises: determining a component decomposition of the respective signal-suppressed MR data portion; modifying the component decomposition by setting at least one component value of the component decomposition to a predetermined value or by multiplying at least one component value of the component decomposition by a predetermined weight; and obtaining the respective EMI-suppressed MR data portion using the modified component decomposition.

In some embodiments, the MRI system comprises multiple radio frequency (RF) coils, and each data portion, of the plurality of data portions, comprises measurements for its respective frequency or time bin, of the plurality of frequency or time bins, made by each of the multiple RF coils.

In some embodiments, data in the respective signal-suppressed data portion is organized as an $N_c \times M$ matrix, where $N_c$ is an integer representing the number of RF coils and M is an integer representing the number of measurements made by each of the RF coils, and determining the component decomposition of the respective-signal suppressed MR data portion comprises determining a singular value decomposition of the $N_c \times M$ matrix.

In some embodiments, data in the respective signal-suppressed data portion is organized as an $N_c \times M$ matrix, where Ne is an integer representing the number of RF coils and M represents a set of multiple dimensions of the number of measurements made by each of the RF coils, and determining the component decomposition of the respective-signal suppressed MR data portion comprises determining a higher-order singular value decomposition of the $N_c \times M$ matrix.

In some embodiments, the decomposition is performed using one of a number of component analysis methods including but not limited to principal component analysis (PCA), independent component analysis (ICA), or sparse principal component analysis (SPCA).

In some embodiments, the method further comprises, before identifying the first subset of the MR data, generating the MR data by operating the MRI system in accordance with a spin echo or a gradient echo pulse sequence.

In some embodiments, the spin echo pulse sequence is selected from a group consisting of a T1 pulse sequence, a T2 pulse sequence, a fluid-attenuated inversion recovering (FLAIR) pulse sequence, and a diffusion weighted imaging (DWI) pulse sequence.

In some embodiments, the method further comprises, after generating the MR data and before identifying the first subset, suppressing EMI in the MR data that is detected by an auxiliary coil of the MRI system.

In some embodiments, the EMI is narrowband EMI, the MR data comprises sensor domain data in a plurality of frequency bins, and the EMI is present in a frequency or time bin of the plurality of frequency or time bins.

In some embodiments, the EMI is present in no more than a threshold number of neighboring frequency or time bins of the plurality of frequency or time bins.

In some embodiments, the EMI is present in an $n^{th}$ frequency or time bin of the plurality of frequency or time bins and applying the filter to the first subset of MR data comprises computing a weighted linear combination of data in multiple frequency or time bins, including the $n^{th}$ frequency or time bin, with the weights determined by coefficients of the filter.

In some embodiments, the MR data comprises data in a plurality of frequency or time bins, the EMI is present in a plurality of neighboring frequency or time bins, and applying the filter to the first subset of the MR data comprises applying a convolutional filter having a length equal to at least a number of the neighboring frequency or time bins of the plurality of neighboring frequency or time bins.

In some embodiments, identifying the first subset of the MR data comprises identifying data in a single or time frequency bin or a set of neighboring frequency or time bins of the MR data that is affected by EMI.

In some embodiments, identifying the first subset of the MR data is performed by analyzing a portion of the MR data acquired during at least one predetermined echo signal of a pulse sequence used to acquire the MR data.

In some embodiments, identifying the first subset of the MR data comprises determining whether data in the one frequency or time bin or in the set of neighboring frequency or time bins has a magnitude greater than a threshold value.

In some embodiments, generating the MR image comprises modifying the MR data by replacing the first subset of the MR data with the second subset of the MR data to obtain modified MR data; and generating the MR image using the modified MR data.

In some embodiments, the MRI system comprises radio frequency (RF) coils configured to transmit RF pulses, and determining the first subset of the MR data comprises transforming the MR data into a reference frame of the transmitted RF pulses.

Some embodiments provide for a magnetic resonance imaging (MRI) system, comprising: a magnetics system having a plurality of magnetics components to produce magnetic fields for performing MRI by acquiring MR data; and at least one processor configured to perform: identifying a first subset of the MR data that is affected by electromagnetic interference (EMI); suppressing EMI in the first subset of the MR data to obtain a second subset of the MR data by: applying a filter to the first subset of the MR data in order to suppress contribution of MR spin echo signals in the first subset of the MR data thereby obtaining signal-suppressed MR data; suppressing EMI in the signal-suppressed MR data to obtain EMI-suppressed MR data; and applying an inverse of the filter to the EMI-suppressed MR data to obtain the second subset of the MR data; generating an MR image using the second subset of the MR data; and outputting the generated MR image.

Some embodiments provide for at least one tangible computer readable storage medium storing processor-executable instructions that, when executed by at least one processor, cause the at least one processor to perform a method for suppressing electromagnetic interference (EMI) in magnetic resonance (MR) data obtained by a magnetic resonance imaging (MRI) system, the method comprising: identifying a first subset of the MR data that is affected by EMI; suppressing EMI in the first subset of the MR data to obtain a second subset of the MR data by: applying a filter to the first subset of the MR data in order to suppress contribution of MR spin echo signals in the first subset of the MR data thereby obtaining signal-suppressed MR data; suppressing EMI in the signal-suppressed MR data to obtain EMI-suppressed MR data; and applying an inverse of the filter to the EMI-suppressed MR data to obtain the second subset of the MR data; generating an MR image using the second subset of the MR data; and outputting the generated MR image.

BRIEF DESCRIPTION OF DRAWINGS

Various aspects and embodiments will be described with reference to the following figures. It should be appreciated that the figures are not drawn to scale. In the drawings, each identical or nearly identical component that is illustrated in various figures is represented by a like numeral. For purposes of clarity, not every component may be labeled in every drawing.

FIG. 4 illustrates pseudocode for performing EMI suppression, in accordance with some embodiments.

DETAILED DESCRIPTION

Figure 1:
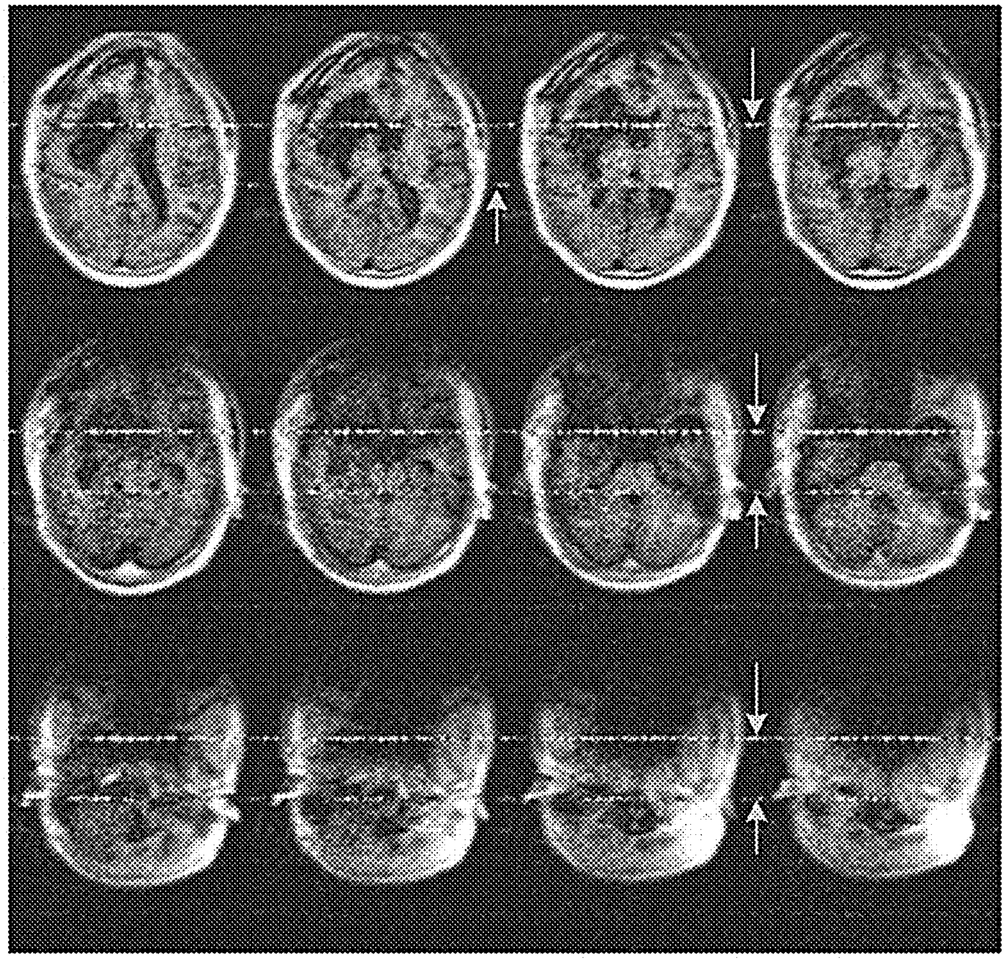
FIG. 1 shows magnetic resonance (MR) images of a patient's brain including narrowband electromagnetic interference (EMI), in accordance with some embodiments.

Conventional clinical magnetic resonance imaging (MRI) systems may typically located in rooms that are specially shielded to prevent electromagnetic interference (EMI) from impeding their correct operation. In addition to protecting people and equipment from the magnetic fields generated by the MRI system, shielded rooms may prevent artefacts such as RF interference generated by various external electronic devices (e.g., other medical devices) from affecting the operation of the MRI system and the quality of the resulting images. To operate outside of a specially shielded room and, more particularly, to allow for generally portable MRI, MRI systems may be capable of operation in relatively uncontrolled electromagnetic environments (e.g., in unshielded or partially-shielded rooms) and generally may be able to account for and/or to compensate for the presence of sources of interference and/or noise that might be present in such environments and that may introduce artefacts into acquired MR images.

MRI systems, when not shielded from EMI, may be affected by a variety of sources of interference, each of which may require a different mitigation strategy. Some sources of interference may be external to the MRI system. These sources include patient monitoring equipment (e.g., electrocardiogram (ECG) equipment), patient medical devices (e.g., intracranial electroencephalography (EEG) devices), and other active electronic equipment placed near the MRI system (e.g., computers, tablets, telephones, mobile and/or smart phones, wearable electronic devices, etc.). These external interference sources may generate incoherent noise that may not be synchronized with the radio frequency (RF) transmission of the MRI system.

Some sources of interference may be internal to the MRI system and may generate coherent noise that might be synchronized with the RF transmission of the MRI system. As a first example, where an MRI system includes permanent magnets (e.g., as the primary $B_0$ field magnets, as shim magnets, etc.), the permanent magnets may be affected by magnetostriction effects during operation of the MRI system. Magnetostriction is the change in shape of a magnetic material during the process of magnetization, and applied magnetic fields (e.g., gradient magnetic fields, transmitted RF signals) may cause the permanent magnets of the MRI system to change shape or dimension and thereby affect the magnitude and/or homogeneity of the $B_0$ magnetic field, which may be detected as an artefact in the acquired MR images. Magnetostriction noise may create a low-amplitude noise line and may appear as a "zipper" line noise artifact perpendicular to the imaging readout direction. As another example of an internal source of EMI, the RF transmission electronics of the MRI system may also generate coherent line noise synchronized with the RF transmission of the MRI system.

In addition to being affected by EMI generated by various sources of interference, MRI systems, when unshielded, may be affected by different types of EMI, including broadband and narrowband EMI. Broadband (sometimes termed "wideband") EMI may be present in a wide range of (e.g., all or substantially all) frequencies and may span the entire bandwidth of the acquired signal (e.g., 64 kHz). Acquired MR data may include multiple spatial frequencies organized in a plurality of frequency bins and broadband EMI may be present in all or substantially all the frequency bins in the plurality of frequency bins. As such, MR images affected by broadband EMI generally include artefacts affecting the MR image as a whole, because the broadband EMI affects most, or all of the frequencies probed during MR imaging.

By contrast, narrowband EMI may be present in a single frequency bin or within a threshold number of neighboring frequency bins such that the spectral content of the EMI may be present in a narrow range of frequencies. For example, narrowband EMI may be present in a single frequency bin, within two neighboring frequency bins, within five neighboring frequency bins, within ten neighboring frequency bins, or within 25 neighboring frequency bins. As an example, if each frequency bin corresponds to a bandwidth of about 670 Hz, then narrowband EMI having 1 kHz bandwidth may be present within two neighboring frequency bins. As described herein, narrowband EMI typically appears as "zipper" line noise artefacts perpendicular to the imaging readout direction. These zipper line noise artefacts may affect a single line, or few neighboring lines, of the MR image. Examples of narrowband EMI artefacts may be seen in FIG. 1, which includes MR images of a subject's brain. Arrows point to the horizontal bands of zipper line noise that may be caused by narrowband EMI.

In a non-limiting example, EMI may be characterized as narrowband in a domain other than spectral frequency. For example, if a signal-suppressed data portion is organized as an $N_c \times N_t \times M$ matrix, where $N_c$ is an integer representing the number of RF coils, $N_t$ is an integer representing the number of time points for each data acquisition, and M represents a set of one or more dimensions of the number of measurements made by each of the RF coils, a Fourier or other wavelet transform may be applied along either the $N_t$, or M dimensions, or both. In the transformed basis, a noise source may also be narrowband. A non-limiting example of a narrowband noise source in this transformed domain would be a noise source that was wide band in spectral frequency domain, but constant in time across acquisition numbers. Such a noise source would be narrowband in a domain of frequency of appearance over the M number of measurements.

In some embodiments, the domain transform may be applied along the acquisition time domain dimension, and/or applied along a dimension comprising numbers of acquisitions. The domain transform may be a Fourier transform or a wavelet transform. With this, a noise source could be classified as narrowband if it occupies a narrow range of frequency spectrum. Or a noise source may occupy a wide band of frequency spectrum but be classifiable as narrowband based on frequency of occurrence. Or a noise source may be both narrow in occurrence and spectral frequency bands.

In some MRI systems, conventional noise suppression techniques may be applied to the data set as a whole and may not sufficiently suppress narrowband EMI artefacts, causing the narrowband EMI artefacts to potentially interfere with clinical utility of the MR images. Described herein are new techniques that may reduce the impact of narrowband EMI artefacts on MR images. These techniques may allow for operation of MRI systems in the presence of one or more sources of narrowband EMI. In addition, while the techniques described herein may allow for operation of MRI systems in the presence of narrowband EMI, these techniques may also be used to mitigate the impact of narrowband interference on the operation of an MRI system in shielded or semi-shielded environments, as aspects of the technology described herein are not limited in this respect.

The techniques described herein may enable the suppression of EMI in MR images by targeting the portions of the MR data affected by the EMI. The techniques may include first identifying which portions (e.g., "lines" or "frequency bins") of the MR data may be affected by the EMI and then suppressing the EMI in these identified portions. In the identified portions, the EMI may be suppressed by first applying a filter to the MR data. The filter may be designed to suppress the contribution of MR spin echo signals to the MR data so that the EMI is the dominant contributor to the filtered data (i.e., data generated as a result of applying the filter to MR data). The EMI may then be suppressed in the filtered data to obtain EMI-suppressed data (e.g., by computing a singular value decomposition of the filtered data and setting at least one singular value, for example, the first, singular value to zero), and an inverse of the filter may be applied to obtain versions of the identified portions of the MR data with the EMI contribution suppressed. This process may be repeated until no further MR data portions (e.g., no additional lines) may be identified as having EMI. Thereafter, an MR image may be generated and output using these EMI-suppressed portions of the MR data. The filter may be, or may comprise, in a non-limiting example, a convolutional filter. In other non-limiting example implementations, the filter may be, or may comprise, an apodization filter. In yet other non-limiting examples, the filter may involve applying singular value decomposition (SVD) or higher-order singular value decomposition (HOSVD). In yet other non-limiting examples, the filter may be, or may comprise, component decomposition such as independent component analysis (ICA) or principle component analysis (PCA). In yet other non-limiting examples, the filter may be, or may comprise, a combination of two or more filters or other operations.

In some embodiments, the MR data may include a number of frequency bins, each frequency bin including a portion of the MR data (e.g., a portion of the MR data acquired at a specific frequency). In some embodiments, identifying the portion of the MR data affected by the EMI may include identifying MR data in a single frequency bin or in multiple frequency bins. The multiple frequency bins may include one set of neighboring frequency bins or multiple sets of neighboring frequency bins, which sets do not neighbor one another. Neighboring frequency bins may be frequency bins whose respective frequency ranges are no more than a threshold Hz apart (e.g., 0 Hz apart). A set of neighboring frequency bins may include no more than a threshold number (e.g., 2, 5, 10, 25, 50, etc.) of neighboring frequency bins. In some embodiments, the threshold number of frequency bins may depend on the sampling frequency of the MRI device (e.g., the threshold number may be set higher when there may be a greater sampling frequency). In some embodiments, the length of the filter applied to the MR data may be set as a function of the number of neighboring frequency bins in which EMI may be suppressed.

In some embodiments, suppressing the EMI in the identified portions of the MR data that may be affected by the EMI may include, for each identified portion of the MR data: applying the filter to the particular data portion to obtain a respective signal-suppressed MR data portion; suppressing EMI in the respective signal-suppressed MR data portion to obtain a respective EMI-suppressed MR data portion; and applying the inverse of the filter to the EMI-suppressed MR data portion.

In some embodiments, suppressing the EMI in the signal-suppressed MR data may be implemented using a component decomposition process, which may include a singular value decomposition (SVD), an independent component analysis (ICA), or a principle component analysis (PCA). In one or more non-limiting example implementations, an SVD of the filtered data may be determined, and the SVD may be modified to suppress the contributions of the EMI. In some embodiments, the SVD may be modified by setting at least one singular value of the SVD to zero (e.g., by setting the first singular value of the SVD to zero, by setting the first two, three, or a threshold number of singular values of the SVD to zero). In other embodiments, the SVD may be modified by multiplying one or more singular values of the SVD by a number between 0 and 1 (e.g., by multiplying the first singular value of the SVD by a number between 0 and 1, by multiplying the first two, three, or a threshold number of singular values of the SVD by a number between 0 and 1). The EMI-suppressed data may then be determined using the modified SVD. However, in other embodiments, one or more other techniques may be used instead of the SVD approach to suppress noise in the filtered data. In some embodiments, principal components analysis (PCA) may be used to suppress noise in the filtered data. In some embodiments, independent components analysis (ICA) may be used to suppress noise in the filtered data.

In some embodiments, the MRI system may include multiple RF coils (e.g., 2, 4, 8, 16, 32, etc.), and each data portion, of the plurality of data portions, includes measurements for its respective frequency bin, of the plurality of frequency bins, made by each of the multiple RF coils. In some embodiments, data in the respective signal-suppressed data portion may be organized as an $N_c \times M$ matrix, where $N_c$ is an integer representing the number of RF coils and M is an integer representing the number of measurements made by each of the RF coils, and wherein determining the SVD of the respective-signal suppressed MR data portion comprises determining a singular value decomposition of the $N_c \times M$ matrix. The singular value decomposition may be computed in any suitable way including by using any suitable software library for performing numerical linear algebraic algorithms.

In some embodiments, before identifying the first subset of the MR data, the MR data may be generated by operating the MRI system in accordance with a spin echo pulse sequence. A spin echo MR signal may have a characteristic linear phase which results in an echo at the center of the acquisition and, as a result, the spin echo MR signal may alternate phase between even and odd points. By contrast, EMI noise may not consistently match this signal pattern through the duration of an entire image acquisition. For this reason, a filter may be used to suppress contribution of the spin echo MR signal leaving the EMI as the dominant contributor to the signal from applying the convolutional filter to the MR data. The filter may be, in a non-limiting example, a convolutional filter.

The techniques described herein may be applied to any of numerous types of spin echo and/or gradient echo pulse sequences. For example, the techniques described herein may be applied to a T1 pulse sequence, a T2 pulse sequence, a fluid-attenuated inversion recovering (FLAIR) pulse sequence, a diffusion weighted imaging (DWI) pulse sequence, and/or other spin echo and/or gradient echo pulse sequences currently in use or to be developed.

In some embodiments, after generating the MR data and before identifying the first subset, a portion of the EMI may be detected by an auxiliary coil of the MRI system and suppressed in the MR data.

In some embodiments, the EMI may be narrowband EMI. In some embodiments, the MR data may include sensor domain data having a plurality of frequency bins, and the EMI may be present in a frequency bin of the plurality of frequency bins. Alternatively, the EMI may be present in a set of neighboring frequency bins having a threshold number (e.g., 2, 5, 10, 25, 50, etc.) of neighboring frequency bins of the plurality of frequency bins. Alternatively, the EMI may be present in each of multiple sets of neighboring frequency bins, which sets do not neighbor each other.

In some embodiments, the EMI may be present in an $n^{th}$ frequency bin of the plurality of frequency bins, and wherein applying the filter to the first subset of MR data comprises computing a weighted linear combination of data in multiple frequency bins, including the $n^{th}$ frequency bin, with the weights determined by the coefficients of a convolutional filter.

In some embodiments, the MR data may include a plurality of frequency bins, the EMI may be present in a plurality of neighboring frequency bins, and applying the filter to the first subset of the MR data may include applying a filter having a length. The length of the filter may be equal to at least a number of the neighboring frequency bins in which the EMI may be present. In some embodiments, if the number of frequency bins in the band is an even number, then the size of the filter may be chosen to be equal to the number of frequency bins in the band. If the number of frequency bins in the band is an odd number, then the size of the filter may be chosen to be equal to one greater than the number of frequency bins in the band.

In some embodiments, identifying the first subset of the MR data may include identifying data in a single frequency bin or a set of neighboring frequency bins of the MR data that may be affected by EMI.

In some embodiments, identifying the first subset of the MR data may be performed by analyzing a portion of the MR data acquired by probing the edge of k-space. For example, identifying the first subset of the MR data may be performed by analyzing one or more echo signals acquired from the edge of k-space. In some embodiments, identifying the first subset of the MR data may be performed by analyzing a portion of the MR data acquired during two echo signals at an end of a repetition period of a pulse sequence used to acquire the MR data. In some embodiments, identifying the first subset of the MR data comprises identifying any frequency bins within which the portion of the data being analyzed has a magnitude greater than a threshold value.

In some embodiments, generating the MR image may include modifying the MR data by replacing the first subset of the MR data with the second subset of the MR data to obtain modified MR data; and generating the MR image using the modified MR data.

The techniques described herein may be used to suppress (e.g., reduce and/or eliminate) artefacts from MR data obtained by any suitable type of MRI system. In some embodiments, low-field MRI systems may be more susceptible to EMI. In some systems, EMI may be present regardless of the field strength of the MRI system. The techniques described herein may be used to reduce and/or eliminate artefacts from MR data obtained by any suitable type of MRI system. The techniques described herein may not be limited to use with low-field MRI systems or any particular type of MRI systems and may be used with high-field and/or any other suitable type of MRI systems.

"High-field" refers generally to MRI systems presently in use in a clinical setting and, more particularly, to MRI systems operating with a main magnetic field (i.e., a $B_0$ field) at or above 1.5 T, though clinical systems operating between 0.5 T and 1.5 T are often also characterized as "high-field." Field strengths between 0.2 T and 0.5 T have been characterized as "mid-field" and, as field strengths in the high-field regime have continued to increase, field strengths in the range between 0.5 T and 1 T have also been characterized as mid-field. By contrast, "low-field" refers generally to MRI systems operating with a $B_0$ field strength between 0.02 T and 0.2 T, though systems having a $B_0$ field of between 0.2 T and 0.3 T have sometimes been characterized as low-field as a consequence of increased field strengths at the high end of the high-field regime.

Figure 2:
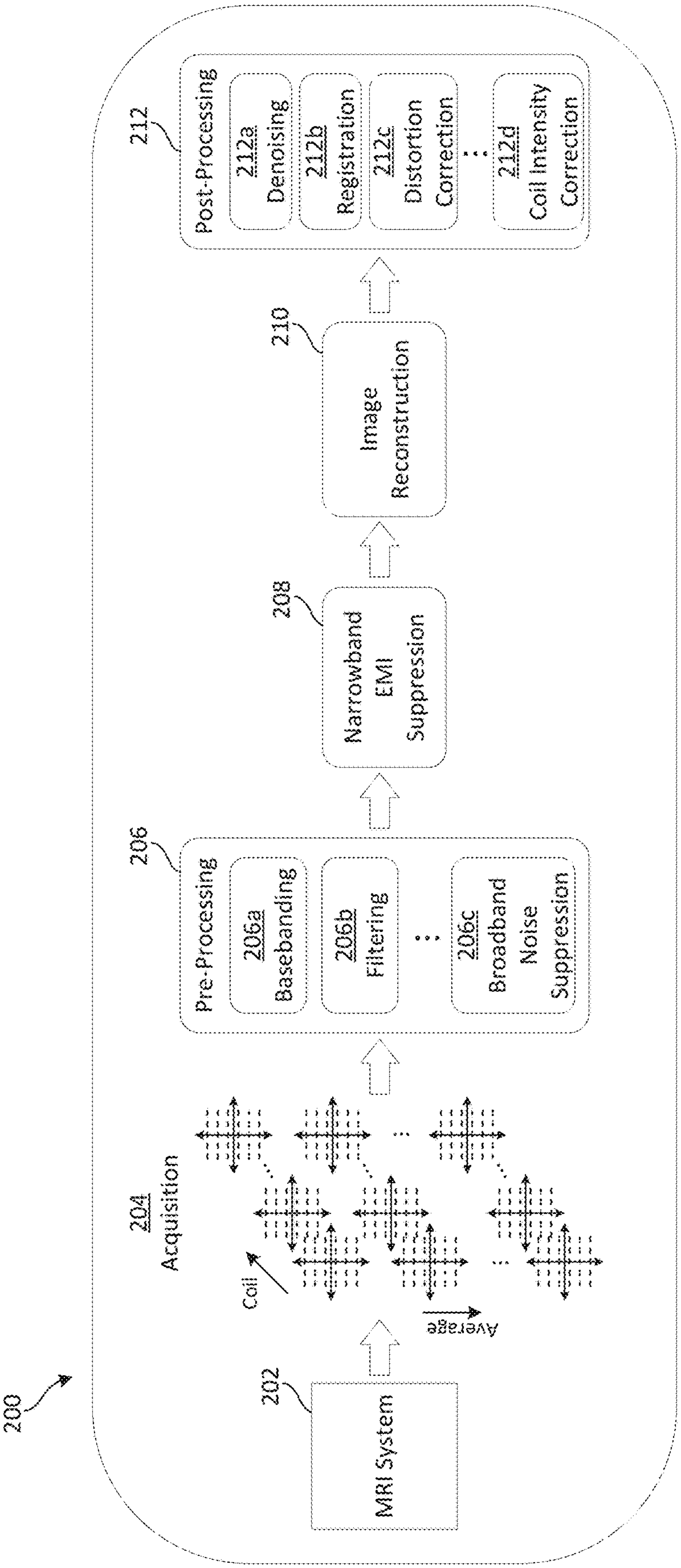
FIG. 2 illustrates a processing pipeline for generating MR images, in accordance with some embodiments.

Techniques for processing medical data to generate MR images of a subject conventionally involve applying different computational tools to perform different tasks that may be part of a data processing pipeline. For example, and as shown in FIG. 2, an MRI system 202 may be used to acquire MR data by imaging a subject (e.g., a human patient, an animal patient, an inanimate object, etc.). As shown in FIG. 2, the MRI system 202 may be a portable or non-portable MRI system. The MRI system 202 may be any type of MRI system, as aspects of the technology described herein are generally not limited to the physical size or portability of the MRI system.

The MR data 204 may be acquired in multiple instances, in some embodiments. For example, and as shown in FIG. 2, multiple acquisitions of data may be made in order to enable averaging of the MR data 204 (e.g., to improve the signal-to-noise ratio and/or to improve the quality of the resulting MR images). Additionally, in some embodiments, the MRI system 202 may include multiple sensors that may be configured to acquire portions of the medical data. The MRI system 202 may include multiple RF coils located at distinct positions relative to the subject, and the multiple RF coils may be used to acquire different portions ("data channels") of the MR data. In some embodiments, the multiple RF coils may include 2 or 4 or 6 or 16 or 32 or more or any other suitable number of RF coils.

Figure 5:
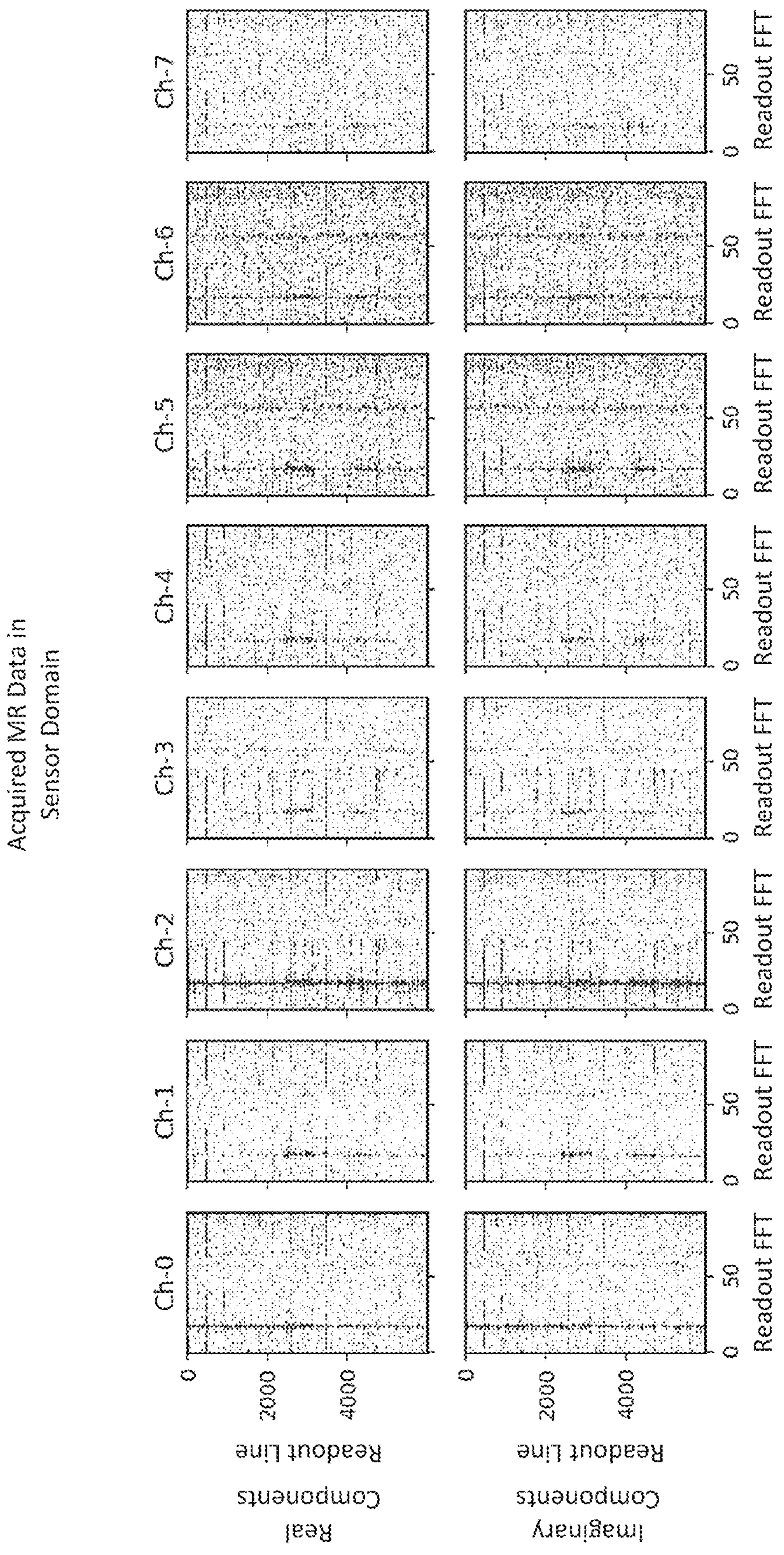
FIG. 5 illustrates MR data acquired using multiple radio frequency (RF) coils and including narrowband EMI, in accordance with some embodiments.

An example of MR data acquired by an MRI system having multiple RF coils and affected by narrowband EMI is shown in FIG. 5. The MR data shown in FIG. 5 includes data obtained from 8 RF coils and is shown in the "sensor domain," with the real components of the acquired complex data shown in the top row and the imaginary components of the acquired complex data shown in the bottom row. Data in the sensor domain may comprise raw sensor measurements obtained by an MRI system. Sensor domain data may include measurements acquired line-by-line for a set of coordinates specified by a sampling pattern. A line of measurements may be termed a "readout" line. Each measurement may be a spatial frequency. As such, sensor domain data may include multiple readout lines. For example, if n readout lines were measured and each readout line included M samples, the sensor domain data may be organized in an M×n matrix. Knowing the k-space coordinates associated with each of the M×n samples, the sensor domain data may be reorganized into the corresponding k-space data and may then be considered to be spatial frequency domain data. Image domain data may be obtained by reconstructing the spatial frequency domain data.

After acquiring the MR data 204, a variety of computational tools may be applied to the MR data 204 as a part of a processing pipeline. For example, as shown in FIG. 2, the processing pipeline may involve performing various pre-processing tasks 206 that may include basebanding 206*a*, filtering 206*b*, and/or broadband noise suppression 206*c*. It should be appreciated that pre-processing tasks 206 may include other processing procedures not shown in the example of FIG. 2, as aspects of the technology described herein are not limited in this respect.

In some embodiments, basebanding 206*a* may include transforming the raw voltage signals from the RF coil(s) into one or more baseband signals. The basebanded signals may be complex signals that may describe a complex envelope of the received voltage signals and may represent an integration of the MR spin echo signals received from the imaged subject. Basebanding 206*a* may be performed, for example, by multiplying incoming data received from the analog-to-digital converters (ADCs) of the MRI system with the baseband frequency. In some embodiments, basebanding 206*a* may further include decimation, reducing the sampling of the received signals from the ADCs. By way of a non-limiting example, in an embodiment, the reduction of sampling may reduce the sampling from a 50 MHz sampling of a 2.7 MHz signal to a 200 kHz sample of a 0 Hz-centered signal.

In some embodiments, filtering 206*b* may include one or more filtering steps to remove or suppress spurious signals that fall outside of the baseband signal. In some embodiments, the filtering 206*b* may include one or more low pass filtering steps to remove or suppress signals that fall outside of the baseband signal. The filtering 206*b* may further include "trimming" of the baseband signal to a desired acquisition bandwidth (e.g., to 64 kHz).

In some embodiments, broadband EMI suppression 206*c* may include any suitable noise suppression techniques applied to the MR data as a whole and arranged to suppress noise affecting the whole of the MR data. In some embodiments, the broadband EMI suppression 206*c* may be based on noise measurements obtained from the environment of the MRI system. The noise measurements may be made by one or more auxiliary sensor(s), as described herein, and may be used to suppress the noise present in MR signals detected by the MRI system during operation.

In some embodiments, differences between the auxiliary sensor(s) and the RF coils (e.g., different physical characteristics, distinct locations relative to the field of view, etc.) configured to receive MR signals from the subject may lead to differences in the characteristics of the noise signals received by the auxiliary sensor(s) and the RF coils. As a result, subtracting the noise signal measured by the auxiliary sensor(s) may not adequately suppress noise detected by the RF coils. Accordingly, in some embodiments, a transfer function may be estimated and used to transform a noise signal received via the one or more auxiliary sensor(s) to an estimate of the noise received by the one or more RF coils. In some embodiments, broadband EMI suppression may include: obtaining samples of noise by using one or more auxiliary sensor(s); obtaining samples of the MR data using the primary RF coil; obtaining a transfer function; transforming the noise samples using the transfer function; and subtracting the transformed noise samples from the obtained MR data to suppress and/or eliminate noise.

Figure 3:
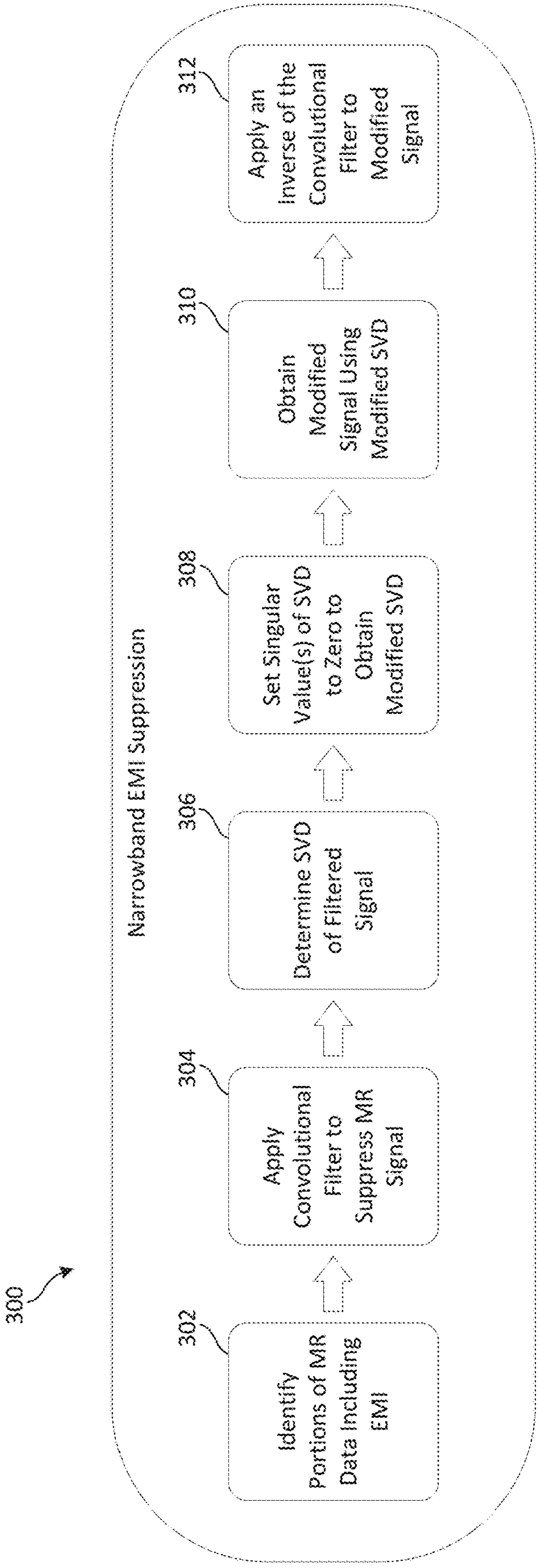
FIG. 3 illustrates a processing pipeline for performing EMI suppression, in accordance with some embodiments.

After pre-processing 206, EMI artefacts may still be present in the MR data. More particularly, narrowband EMI artefacts may still be present in the MR data. Thus, after pre-processing 206 the MR data, the processing pipeline may include narrowband EMI suppression 208. The process of performing narrowband EMI suppression 208 is further described herein. FIG. 3 illustrates an embodiment of a processing pipeline for performing narrowband EMI suppression, and FIG. 4 illustrates an embodiment of pseudocode for performing EMI suppression, in accordance with some embodiments.

In some embodiments, the processing pipeline 300 may begin with a first act 302 of identifying the portions of MR data including EMI, represented by the EMI_index line 402 of pseudocode 400. As indicated in the line 404 of pseudocode 400, processing pipeline 300 may be implemented iteratively until no remaining EMI is identified in the MR data.

In some embodiments, the portions of MR data affected by EMI may be identified based on which frequency bins of the MR data may be affected by EMI. Let y be the complete set of MR data and n the readout index. The MR data at index n is $y_n = s_n + EMI_n$, where $y_n$ is the two-dimensional signal cross-section across the $n^{th}$ readout index, or frequency bin, $s_n$ is the desired MR data, and $EMI_n$ is the EMI interference. The frequency bins including MR data that is affected by EMI may be identified using MR data collected from the end of the spin echo trains, $y_e$. In some embodiments, a portion of the MR data acquired by a subset of the echoes of the spin echo trains may be used to identify which portions of the MR data may be affected by EMI. The subset of echoes used to identify which portions of the MR data may be affected by EMI may be the echoes that probe the edge of k-space. The MR data acquired from the outer edges of k-space may include a small or vanishing contribution to the MR data from the spin echo signals compared to a contribution to the MR data from the source(s) of EMI. In some pulse sequences, echoes at the end of the spin echo trains (e.g., the last echo, the last two echoes, some of the last echoes) may be used to identify which portions of the MR data are affected by EMI. Collectively, the last echoes from all repetition periods of the pulse sequence used to acquire the MR data may form the k-space edge dataset used for detecting frequency bins affected by EMI.

In some embodiments, the absolute value of the dataset, $y_e$, may be used for detecting frequency bins affected by EMI. The $n^{th}$ frequency bin may be identified as being affected by EMI if the magnitude of the data $y_{e_n}$ is greater than a threshold value, where $y_{e_n}$ may be the MR data collected from the end of the spin echo trains of the $n^{th}$ frequency bin. In some embodiments, the $n^{th}$ frequency bin may be flagged as being affected by EMI if the magnitude of the data $y_{e_n}$ satisfies:

$$y_{e_n} > \mu_{y_e} + \theta\sigma_{y_e},$$

where $y_{e_n}$ is the signal at the $n^{th}$ frequency of dataset $y_e$, and $\mu_{y_e}$, $\sigma_{y_e}$ are the mean and standard deviations of $y_e$, respectively and $\theta$ is a pre-defined threshold.

Figure 6:
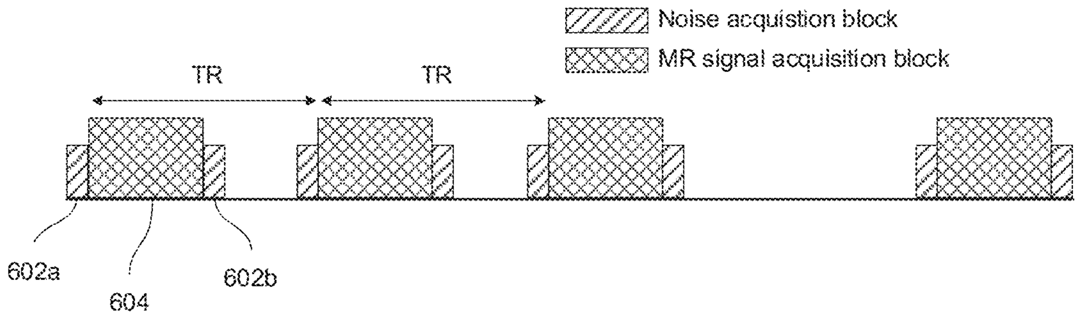
FIG. 6 illustrates a schematic of a pulse sequence including portions for acquiring noise during a pulse repetition period, in accordance with some embodiments.

In some embodiments, the portions of MR data affected by EMI may be identified using one or more methods of measuring external and/or internal EMI. In some embodiments, noise acquisition may be performed in one or more of multiple pulse repetition periods in which little or no MR signal is expected to be detected. In some embodiments, EMI may be acquired before and/or after the MR acquisition block in at least some (e.g., at least one, at least half, all) pulse repetition periods of a spin echo pulse sequence. In FIG. 6, EMI may be acquired during the noise acquisition block 602*a* preceding the MR signal acquisition block 604 and during the noise acquisition block 602*b* following the MR signal acquisition block 604.

To do this, during noise acquisition blocks 602*a* and 602*b*, the RF receiver of the MRI system may be turned on, without the presence of any encoding gradients (which may be achieved by turning off the gradient coils) or RF excitation pulses, so that the primary RF coils and/or the auxiliary RF sensor(s) may acquire noise data that includes EMI (to the extent any is present) but may not include any spin echo MR signals from the subject. In turn, the collected data may be used to determine the frequencies at which the EMI may affect MR data collected during block 604. As such, the collected data may be used to identify portions of the MR data (e.g., frequency bins) in which the amplitude and/or power of the EMI exceeds a threshold. In some embodiments, identifying the portions of the MR data affected by EMI may be performed for each repetition period of a pulse sequence (e.g., using the noise acquisition blocks 602*a*, 602*b* within each respective repetition period) to account for changes in the EMI over the acquisition period (e.g., due to a drift in the center frequency of the MRI system, due to physical movement of a device emitting EMI relative to the MRI system). In some embodiments, identifying the portions of the MR data affected by EMI may be performed for the first and last repetition period of a pulse sequence, performed for a subset of the repetition periods of a pulse sequence, and/or performed for at least half of the repetition periods of a pulse sequence.

Figure 7:
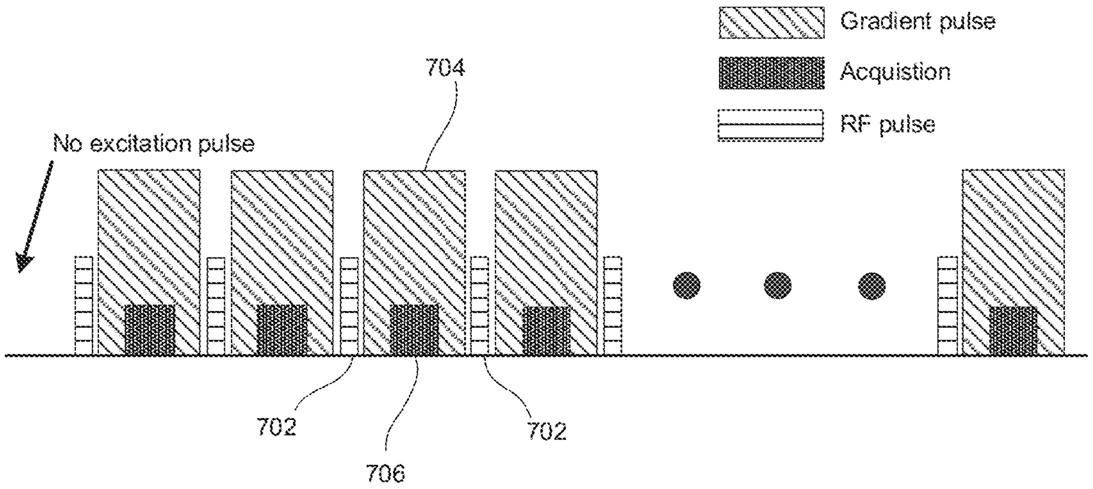
FIG. 7 illustrates a schematic of a noise acquisition block configured to capture EMI caused by internal and external EMI sources, in accordance with some embodiments.
Figure 8:
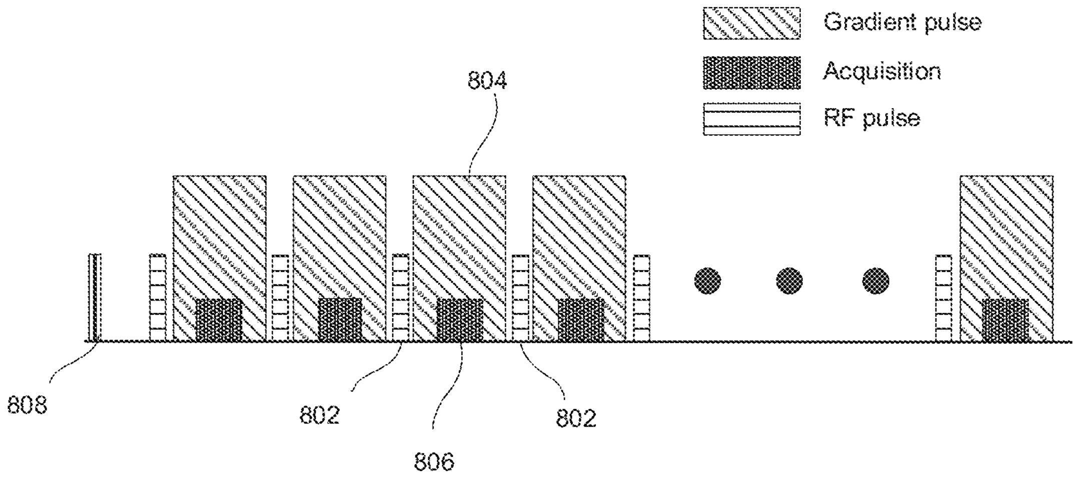
FIG. 8 illustrates an alternative schematic of a noise acquisition block to capture EMI caused by internal and external EMI sources, including EMI caused by operating gradient coils and RF coils, in accordance with some embodiments.

As described herein, the noise acquisition blocks 602*a* and 602*b* may be configured to detect noise generated by external sources of EMI. In some embodiments, however, it may be desirable to also detect EMI generated by sources of EMI internal to the MRI system. In some embodiments, electronic components of the MRI system (e.g., gradient and/or RF coils and/or electronics) may generate or otherwise induce EMI during operation of the MRI system. The noise acquisition blocks may be configured to cause the gradient coils and/or RF transmission coils to operate during the noise acquisition blocks to detect EMI generated by internal sources. Examples of noise acquisition blocks for detecting EMI generated by both internal and external sources of EMI are shown in FIGS. 7 and 8.

In some embodiments, the noise acquisition blocks may include an alternating series of RF pulses 702, 802 and gradient pulses 704, 804 with acquisition 706, 806 being performed while gradient pulses 704, 804 are generated by the MRI system. Acquisition 706, 806 may be performed by turning on the RF receivers and turning off the RF transmitters of the MRI system. The RF pulses 702, 802 may be refocusing pulses configured to flip (e.g., by 180°) a direction of the magnetization vector of spins in the field of view. The RF pulses 702, 802 may preferably not be 90° pulses, which may cause the net magnetization of spins in the field of view to tip into the transverse plane and to emit spin echo MR signals as the spins relax back to the longitudinal plane.

In some embodiments, the gradient pulses may be configured to suppress MR spin echo signals from the subject and may not include phase encoding gradient pulses. In some embodiments, correction gradients ("crusher" gradients) may be included in the noise acquisition blocks to dephase and/or otherwise suppress MR spin echo signal generated by spins within the field of view of the MRI system. In this manner, the RF receivers of the MRI system may acquire noise data including EMI caused by external and internal EMI sources.

In some embodiments, the noise acquisition blocks may be configured based on the type and/or parameters of the pulse sequence used to acquire the MR signal. The noise acquisition blocks may be configured to mimic the parameters of the pulse sequences used to acquire the MR signal so that the acquired EMI caused by internal EMI sources may be similar to the internal EMI generated during the pulse sequence used to acquire the MR signal. In some embodiments, the noise acquisition blocks may include an RF excitation pulse 808. The RF excitation pulse 808 may be included when the pulse sequence used to acquire the MR signal is a fast spin echo (FSE) pulse sequence.

In some embodiments, the portions of MR data affected by EMI may be identified using one or more advanced peak picking algorithms. In some embodiments, Bayesian peak picking, non-negative matrix factorization, and/or undecimated discrete wavelet transform (UDWT) techniques may be used to identify the portions of MR data affected by EMI.

In some embodiments, the portions of MR data affected by EMI may be identified using a portion of the MR data acquisition (e.g., MR data acquired in subset(s) of the repetition periods). In some embodiments, it may be desirable to identify temporal changes in the effects of EMI on the MR data and thereafter apply the EMI suppression techniques described herein to a subset of the MR data based on EMI identified in subset(s) of the MR data acquisition. In some embodiments, an external device emitting EMI may have been present near the MRI system during the first half of the MR data acquisition period and thereafter may have been relocated. It may be desirable to identify a subset including the first half of the MR data acquisition that may have been affected by the EMI caused by the external device and which frequency bin(s) within that first half of the MR data may include the EMI signal. It may also be desirable to apply EMI suppression techniques to the first half of the MR data acquisition. In some embodiments, the subset(s) of MR data may not only be the first half of an MR data acquisition period but could be smaller or larger subset(s), more than one subset, and/or subset(s) not located at a beginning or end of the MR data acquisition period.

In some embodiments, the portions of MR data affected by EMI may be identified using a sliding window. In some embodiments, a first subset of the MR data acquisition may be identified as being affected by EMI and noise suppression, as described herein, may be applied to the first subset of the MR data. Thereafter, a second subset of the MR data (e.g., an adjacent subset, a partially overlapping subset) may be identified as being affected by EMI and noise suppression may be applied to the second subset of the MR data. The identification and noise suppression may be iteratively performed by continuing to "slide" the window across the MR data.

In some embodiments, after identifying the frequency bins containing MR data affected by EMI, for each identified frequency bin as indicated by for loop line 406 of pseudocode 400, a filter may be applied to the MR data, as illustrated by the second act 304 of FIG. 3 and the fifth line 406*a* of the pseudocode 400. In this non-limiting example, a convolutional filter may be arranged to suppress the MR signal contributions, $s_n$, and may be designed based on the characteristics of the spin echo MR signal.

The spin echo MR signal, $s_n$, may have a characteristic linear phase which results in an echo at the center of acquisition. The MR signal may accordingly be described by the Fourier-time shift relationship:

$$s_n(t-t_0) \xrightarrow{\mathcal{F}} e^{-i\omega t_0} X(\omega)$$

where the Fourier transform may be represented by a function of frequency, X(ω), multiplied by a linear phase, $e^{-i\omega t_0}$. For a spin echo MR signal centered at the middle of acquisition at time $$t_0 = \frac{N\delta t}{2},$$

where N may be the total number of sampling points within a readout and δt may be the time duration between sampling points, the phase of the spin echo MR signal alternates phase between even and odd points:

$$e^{-i\omega t_0} = e^{-i\pi n}.$$

Figure 9A:
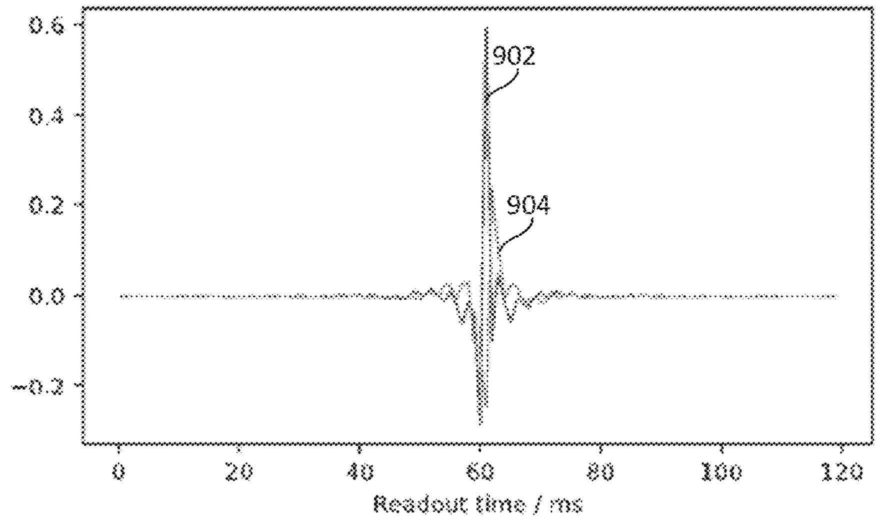
FIGS. 9A and 9B illustrate plots of an MR echo signal in the time and frequency domains, in accordance with some embodiments.
Figure 9B:
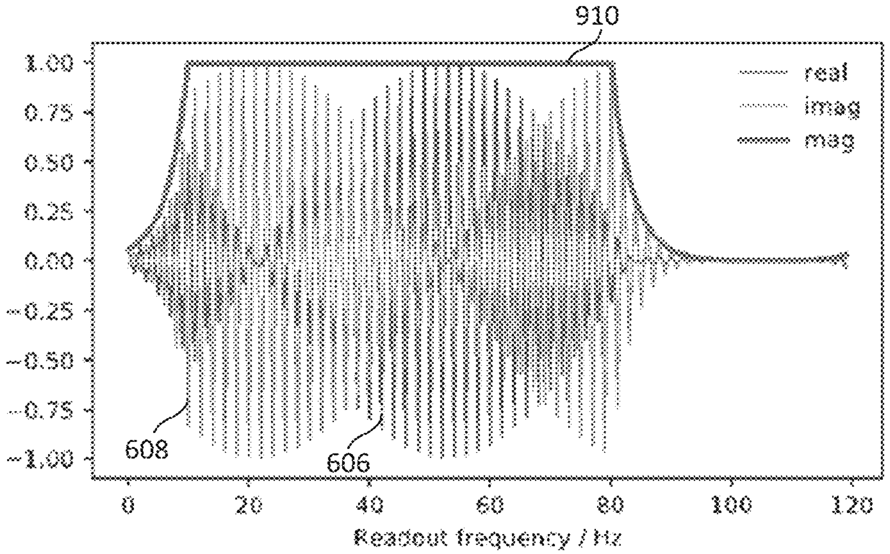

FIGS. 9A and 9B illustrate non-limiting embodiments of an MR echo signal plotted in the time domain and the frequency domain, respectively. In FIG. 9A, the real portion 902 of an exemplary spin echo MR signal and the imaginary portion 904 of the same exemplary spin echo MR signal are overlaid in the time domain. In FIG. 9B, the real portion 906, the imaginary portion 908, and a magnitude 910 of the spin echo MR signal are overlaid in the frequency domain. The real portion 906 and the imaginary portion 908 of the spin echo MR signal exhibit alternating phases as described herein.

Figure 10A:
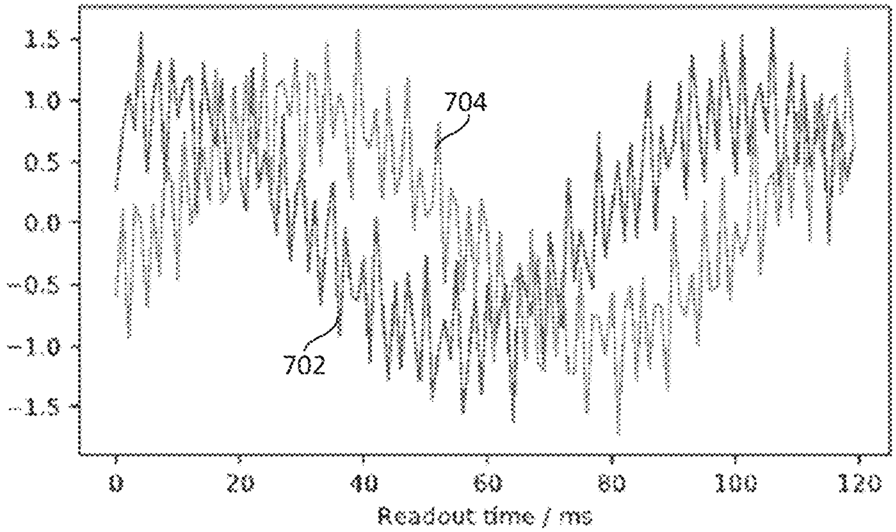
FIGS. 10A and 10B illustrate plots of a narrowband EMI signal in the time and frequency domains, in accordance with some embodiments.
Figure 10B:
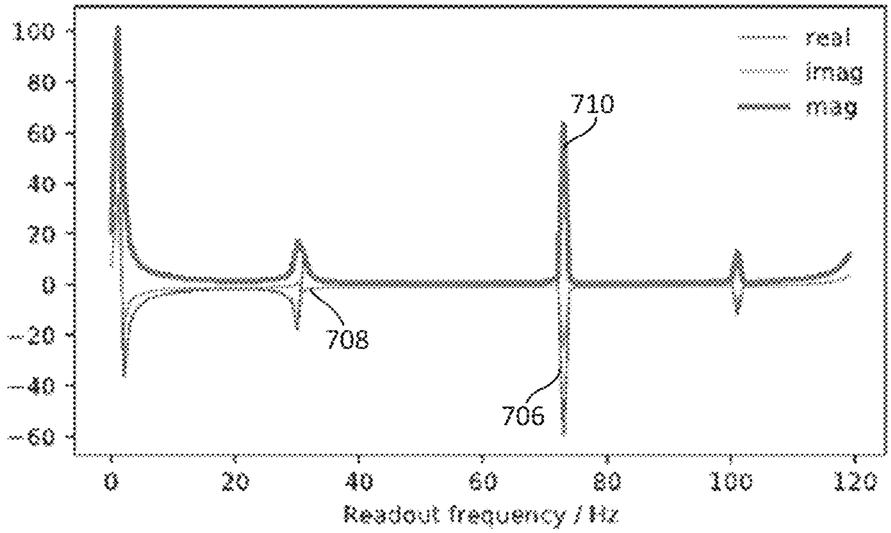

In some embodiments, signal contributions due to EMI are unlikely to match this alternating-phase signal pattern exhibited by the spin echo MR signal. This feature is illustrated by the graphs of FIGS. 10A and 10B, which illustrate an EMI signal plotted in the time domain and frequency domain, respectively, according to some embodiments. In FIG. 10A, the real portion 1002 and the imaginary portion 1004 of an exemplary EMI signal are overlaid in the time domain. In FIG. 10B, the real portion 1006, the imaginary portion 1008, and a magnitude 1010 of the EMI signal are overlaid in the frequency domain. The real portion 1006 and the imaginary portion 1008 exhibit no alternating phases as would be expected from a spin echo MR signal.

In some embodiments, the convolutional filter may be designed based on the differences in phase behavior between the spin echo MR signal and the EMI signal. In some embodiments, if the EMI may be identified in a single frequency bin, n, the following convolutional filter may be applied:

$$[-1, 1, 4, 1, -1].$$

This convolutional filter may apply a wide apodization window which suppresses any signal approximately centered in the acquisition window. This will suppress a large majority of spin echo MR signal, and EMI noise may dominate in the augmented signal, an, which may be rewritten as the following expression:

$$a_n = y_n + \frac{1}{4}[(y_{n-1} + y_{n+1}) - (y_{n-2} + y_{n+2})]$$

In some embodiments, the assumption that the spin echo MR signal is centered at the middle of acquisition may not be accurate, as the position of the spin echo MR signal may drift during MR data acquisition (e.g., due to eddy currents and/or stray magnetic fields). In some embodiments, the convolutional filter may be adapted to compensate for spin echo MR signals that may not be centered at the middle of the acquisition window. For a spin echo MR signal that has drifted by Δt, its Fourier transform may acquire a linear phase across the frequency bins given by:

$$e^{-i\frac{2\pi n\Delta t}{TE}}$$

where TE may be the echo duration. The linear phase may be compensated for by phase modulating the frequency spectrum for all n:

$$z_n = e^{-i\frac{2\pi n\Delta t}{TE}} y_n.$$

The convolutional filter may then be applied to the phase-compensated signal, $z_n$. In some embodiments, the augmented signal, an, may then be written as:

$$a_n = z_n + \frac{1}{2k}[(z_{n-1} + z_{n+1}) - (z_{n-2} + z_{n+2}) + (z_{n-3} + z_{n+3}) + \ldots - (z_{n-k} + z_{n+k})].$$

In some embodiments, EMI may be present in the MR data in consecutive, neighboring frequency bins. In such embodiments, the width of the convolutional filter may be adapted based on the width of the noise band. The width of noise band may be the number of consecutive frequency bins having MR data affected by EMI. In some embodiments, if the interference is detected at indices [1, 2, 3, 16, 17, 48, 61, 62, 63, 64], the indices may be grouped into four bands as:

$$[[1, 2, 3], [16, 17], [48], [61, 62, 63, 64]].$$

For each grouped band of indices with MR data affected by EMI, the size, k, of the convolutional filter may be chosen to be equal to at least the number of indices in the band. If the number of indices in the band is an even number, then the size, k, of the convolutional filter may be chosen to be equal to the number of indices in the band. If the number of indices in the band is an odd number, then the size, k, of the convolutional filter may be chosen to be equal to one greater than the number of indices in the band. For example, for the first band [1, 2, 3], the size of the convolutional filter would be chosen to be k=4, while for the second band [16, 17], the size of the convolutional filter would be chosen to be k=2. The filtered signal, $a_n$, can then be expressed as:

$$a_n = y_n + \frac{1}{2k}[(y_{n-1} + y_{n+1}) - (y_{n-2} + y_{n+2}) + (y_{n-3} + y_{n+3}) + \ldots - (y_{n-k} + y_{n+k})].$$

In some embodiments, after applying the convolutional filter to suppress the spin echo MR signal, a singular value decomposition (SVD) of $a_n$ may be determined, as illustrated by the third act 306 of FIG. 3 and the line 406*b* of pseudocode 400. Using the SVD, the filtered signal, $a_n$, may be written as:

$$a_n = USV^T$$

where $a_n \in \mathbb{C}^{N_c \times M}$, $U \in \mathbb{C}^{N_c \times N_c}$, $S \in \mathbb{R}^{N_c}$, and $V \in \mathbb{C}^{M \times N_c}$.

In some embodiments, the convolutional filter has suppressed the spin echo MR signal in an, the EMI signal may be left to dominate at least the first singular value of the SVD of an. The EMI signal may then be suppressed, and a modified SVD, $(USV^T)'$, may be obtained. The modified SVD may be obtained by setting at least the first singular value of the SVD equal to zero, as illustrated by the fourth act 308 of FIG. 3 and the line 406*c* of pseudocode 400. In some embodiments, the first singular value of the SVD may be set equal to zero to suppress the EMI signal. In other embodiments, the first two, the first few, or some singular values of the SVD may be set equal to zero to suppress the EMI signal.

Alternatively, the modified SVD may be obtained by multiplying ("scaling down") at least the first singular value of the SVD by a number between 0 and 1. In some embodiments, the first singular value may be multiplied by a number between 0 and 1 to reduce the contribution of the EMI to the MR data. In other embodiments, the first two, the first few, or some singular values of the SVD may be multiplied by a number between 0 and 1 to modify the SVD. Modifying the SVD by multiplying at least the first singular value of the SVD by a number between 0 and 1 may suppress a portion of the EMI in the MR data such that some fraction of the EMI remains in the MR data. Iteratively performing the acts of identifying the portions of the MR data affected by remaining EMI and suppressing the EMI may sufficiently suppress the EMI such that the EMI approaches a negligible contribution to the MR data.

In some embodiments, after obtaining the modified SVD by suppressing the EMI signal, a modified signal, $a_n'$, with the contributions of EMI being suppressed, may be obtained using the modified SVD, as illustrated by the fifth act 310 of FIG. 3 and line 406*d* of pseudocode 400. For example, $a_n'$ may be obtained according to:

$$a_n' = (USV^T)'.$$

In some embodiments, the modified signal $a_n'$ may then be used to obtain MR data with contributions due to EMI being suppressed. As illustrated by the sixth act 312 of FIG. 3 and line 406*e* of pseudocode 400, an inverse of the convolutional filter may be applied to the modified signal $a_n'$ to yield the desired EMI-suppressed MR data:

$$y_n' = a_n' - \frac{1}{4}[(y_{n-1} + y_{n+1}) - (y_{n-2} + y_{n+2})].$$

Returning to FIG. 2, in some embodiments, after narrowband EMI suppression 208, the MR image may be generated using image reconstruction 210. In some embodiments, the EMI-suppressed MR data may then be used to generate the MR image. In some embodiments, the original MR data affected by EMI, $y_n$, may be replaced by the EMI-suppressed MR data, $$y_n'.$$

The MR image may then be generated using this modified MR data including the EMI-suppressed MR data, $$y_n'.$$

In some embodiments, the MR image may be generated using image reconstruction techniques to reconstruct the image from the spatial frequency domain to the image domain. Image reconstruction 210 may be performed using any suitable image reconstruction techniques, including but not limited to linear and non-linear reconstruction techniques. Non-limiting examples of linear reconstruction techniques include gridding, principal component analysis (PCA), generalized autocalibrating partial parallel acquisition (GRAPPA), sensitivity encoding (SENSE), and conjugate gradient sensitivity encoding (CG-SENSE). Aspects relating to PCA, GRAPPA, SENSE, and CG-SENSE are described in literature.

In some embodiments, after generating the MR image using image reconstruction 210, additional post-processing 212 may be performed to further refine the MR image. The post-processing 212 may include further denoising 212*a*, image registration 212*b*, distortion correction 212*c*, and/or coil intensity correction 212*d*, in some embodiments.

In some embodiments, post-processing 212 may include further denoising 212*a*. Denoising 212*a* may be arranged to suppress remaining EMI artefacts in the MR images that were not sufficiently suppressed by either the broadband noise suppression 206*c* or the narrowband EMI suppression 208. In some embodiments, denoising 212*a* may include using any suitable noise suppression techniques, including deep learning techniques, to suppress remaining noise in the generated MR images.

In some embodiments, post-processing 212 may include image registration 212*b*. Image registration 212*b* may include techniques to align multiple MR images acquired during operation of the MRI system. Aligning the multiple MR images accurately prior to combining the MR images may improve MR image contrast and quality. In some embodiments, image registration 212*b* may include using any suitable image registration techniques, including deep learning techniques, to align MR images acquired by the MRI system.

In some embodiments, post-processing 212 may include distortion correction 212*c*. Distortion correction 212*c* may correct distortions between multiple MR images acquired during operation of the MRI system. Correcting distortions may improve MR image contrast and quality and provide more clinically accurate MR images. In some embodiments, distortion correction 212*c* may include any suitable distortion correction techniques, including deep learning techniques.

In some embodiments, post-processing 212 may include coil intensity correction 212*d*. Coil intensity correction 212*d* may address differences in contrast caused by different RF coils outputting differing signal intensities due to different physical characteristics (e.g., being located at a different position relative to the field of view of the MRI system). In some embodiments, coil intensity correction 212*d* may include any suitable coil intensity correction techniques, including deep learning techniques.

In some embodiments, post-processing 212 may include other processing procedures not shown in FIG. 2, as study of the present disclosure may reveal a wide range of similar, equivalent, or alternative methods which are covered under the spirit of the present disclosure.

Figure 11B:
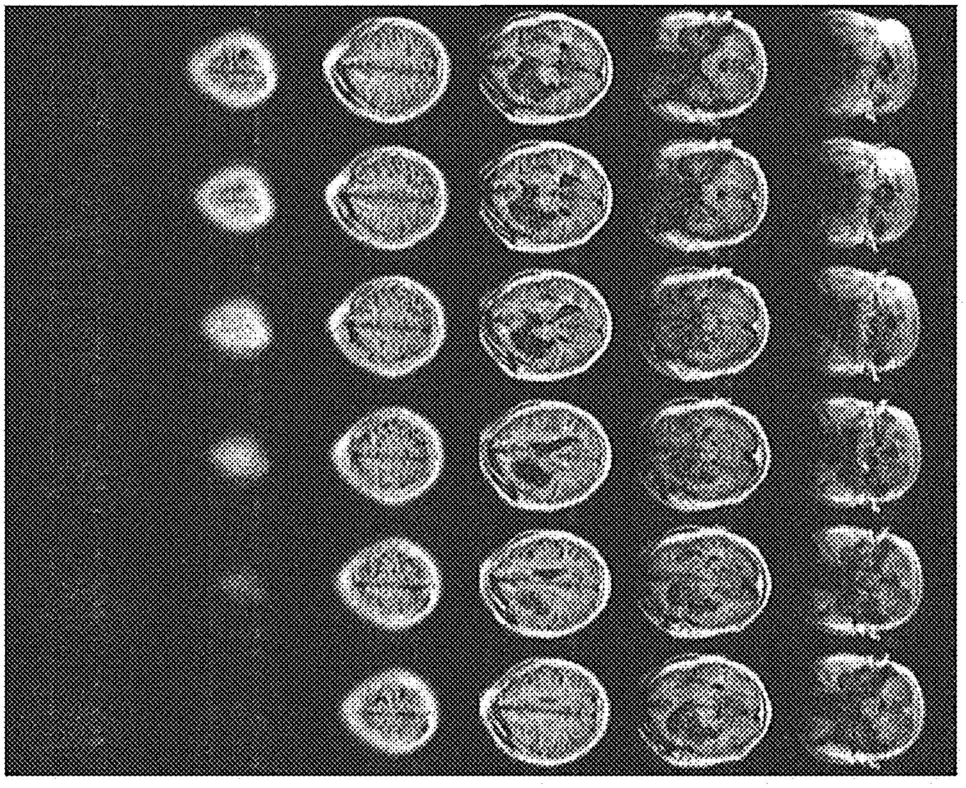
FIG. 11B shows the MR images of FIG. 11A after suppression of the narrowband EMI, in accordance with some embodiments.
Figure 11A:
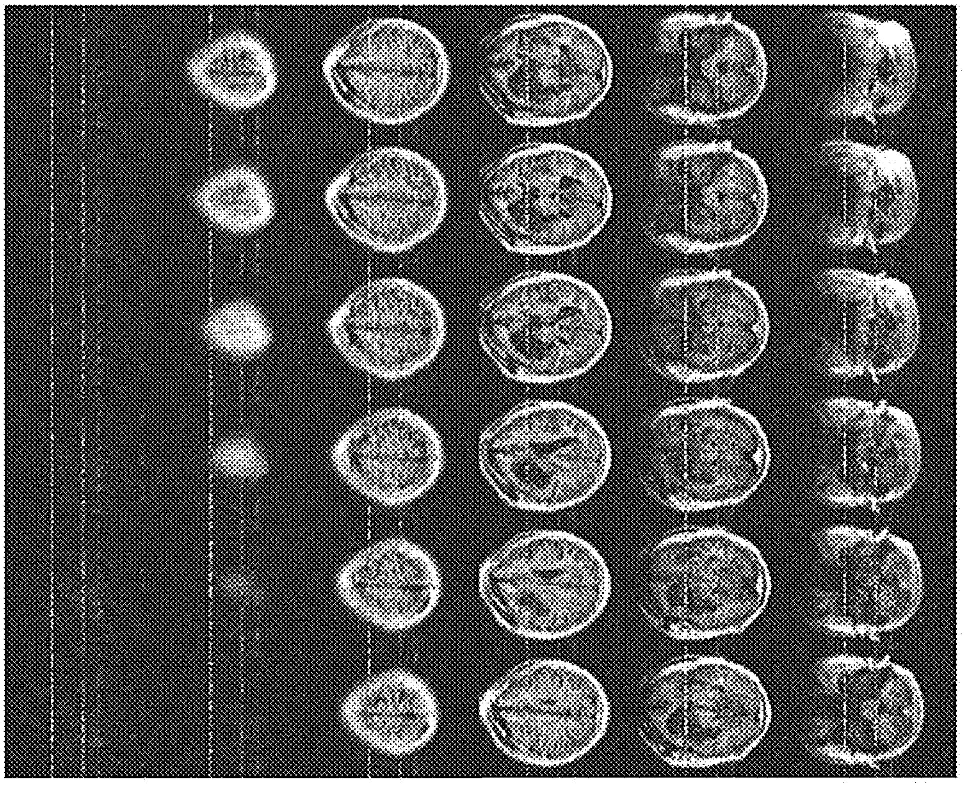
FIG. 11A shows MR images of a subject's brain, the MR images including narrowband EMI, in accordance with some embodiments.

Additional embodiments of narrowband EMI suppression are shown in FIGS. 11A-14B. FIG. 11A shows MR images of a subject's brain, the MR images including narrowband EMI present in horizontal bands extending across the images. FIG. 11B shows the MR images of FIG. 11A after suppression of the narrowband EMI, in accordance with some embodiments described herein.

Figure 12B:
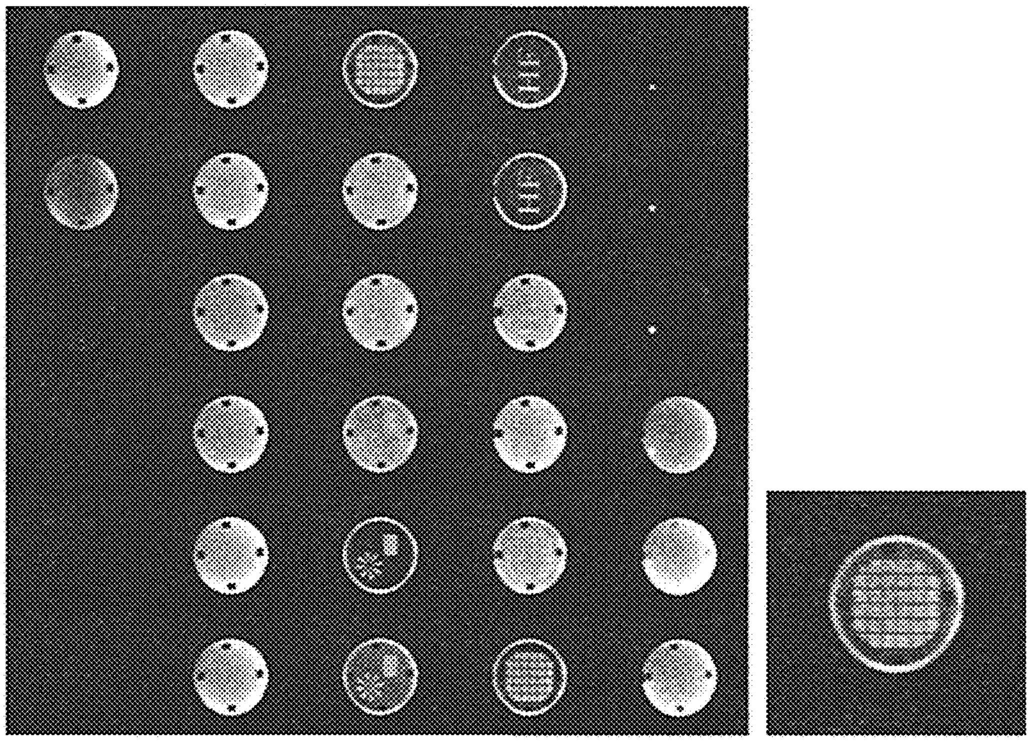
FIG. 12B shows the MR images of FIG. 12A after suppression of the narrowband EMI, in accordance with some embodiments.
Figure 12A:
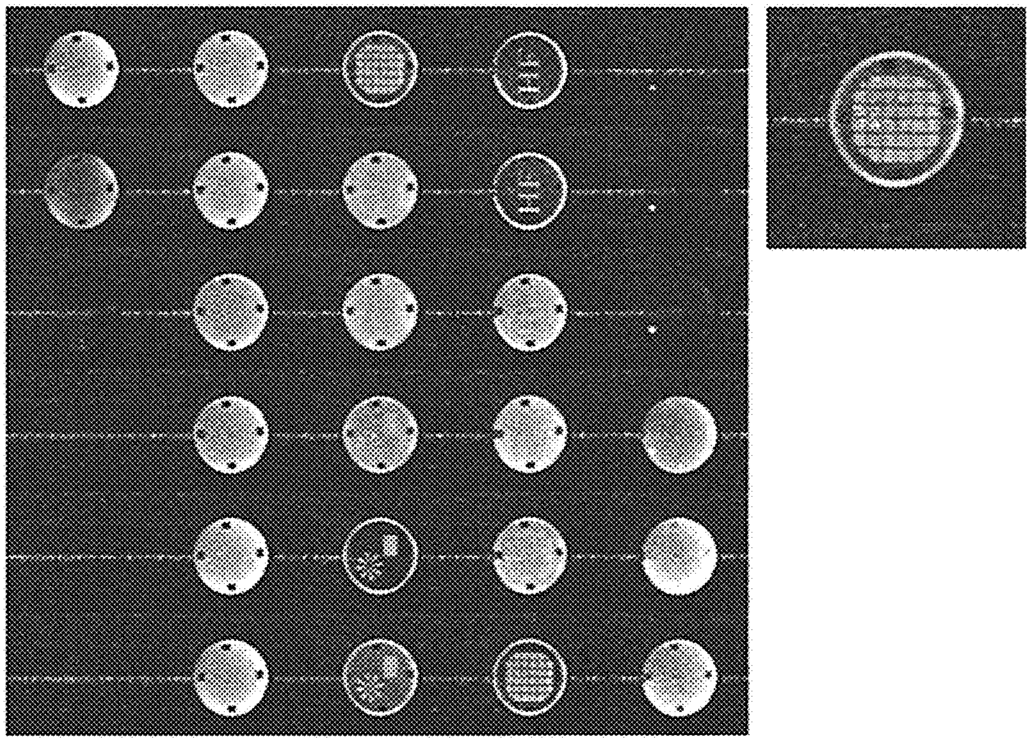
FIG. 12A shows MR images of a phantom, the MR images including narrowband EMI, in accordance with some embodiments.
Figure 13B:
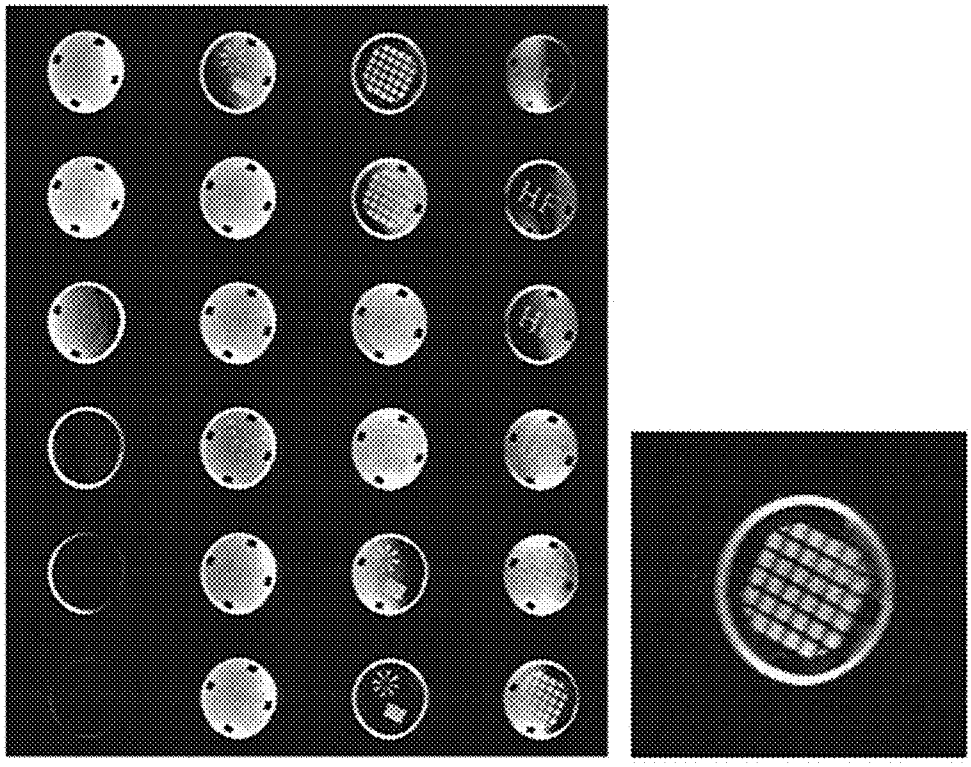
FIG. 13B shows the MR images of FIG. 13A after suppression of the narrowband EMI, in accordance with some embodiments.
Figure 13A:
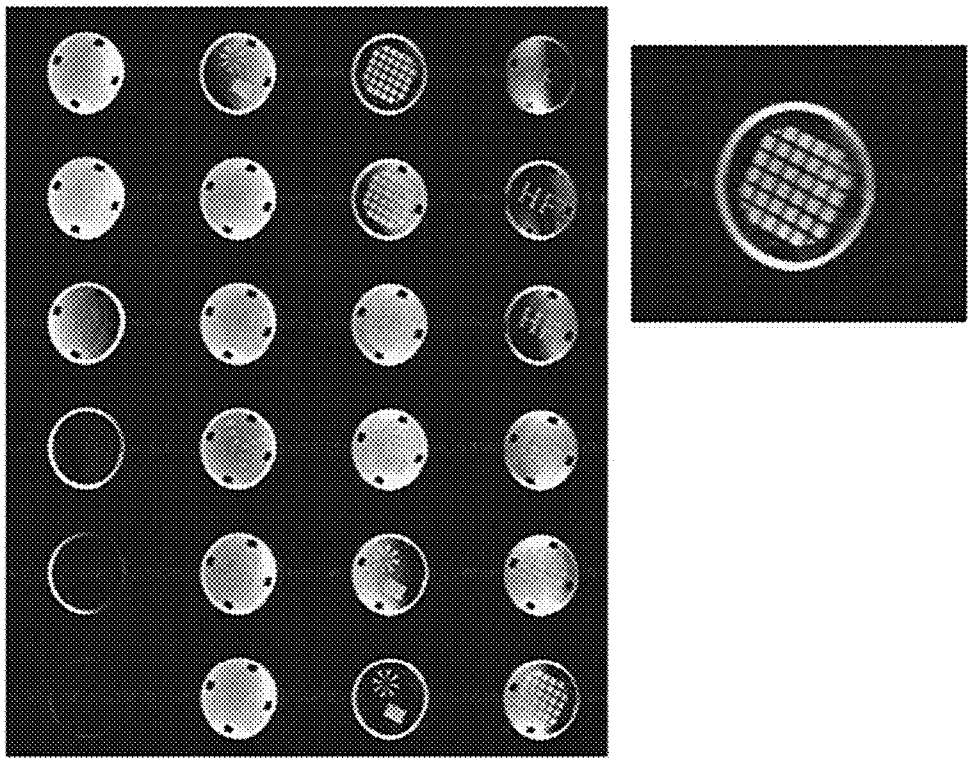
FIG. 13A shows MR images of a phantom, the MR images including narrowband EMI affecting a set of neighboring bins in the MR data, in accordance with some embodiments.

FIGS. 12A and 13A show MR images of an MR phantom, the MR images including narrowband EMI present in vertical band extending through the images. FIGS. 12B and 13B show the MR images of FIGS. 12A and 13A, respectively, after suppression of the narrowband EMI, in accordance with some embodiments of the technology described herein.

Figure 14B:
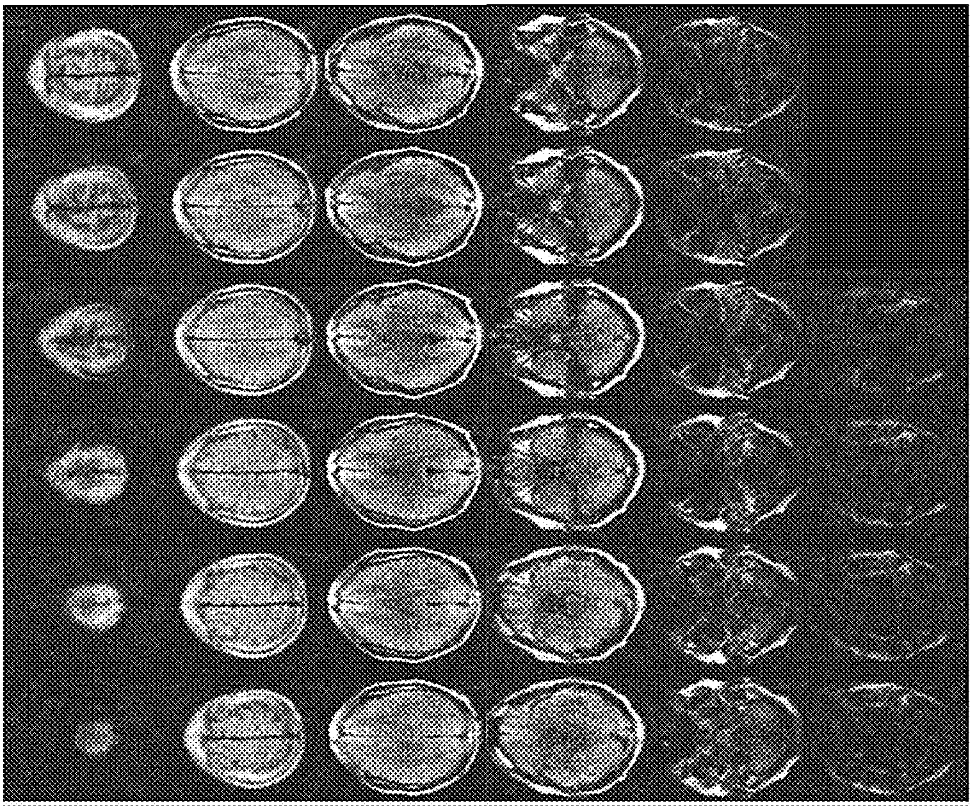
FIG. 14B shows the MR images of FIG. 14A after suppression of the narrowband EMI caused by magnetostriction effects, in accordance with some embodiments.
Figure 14A:
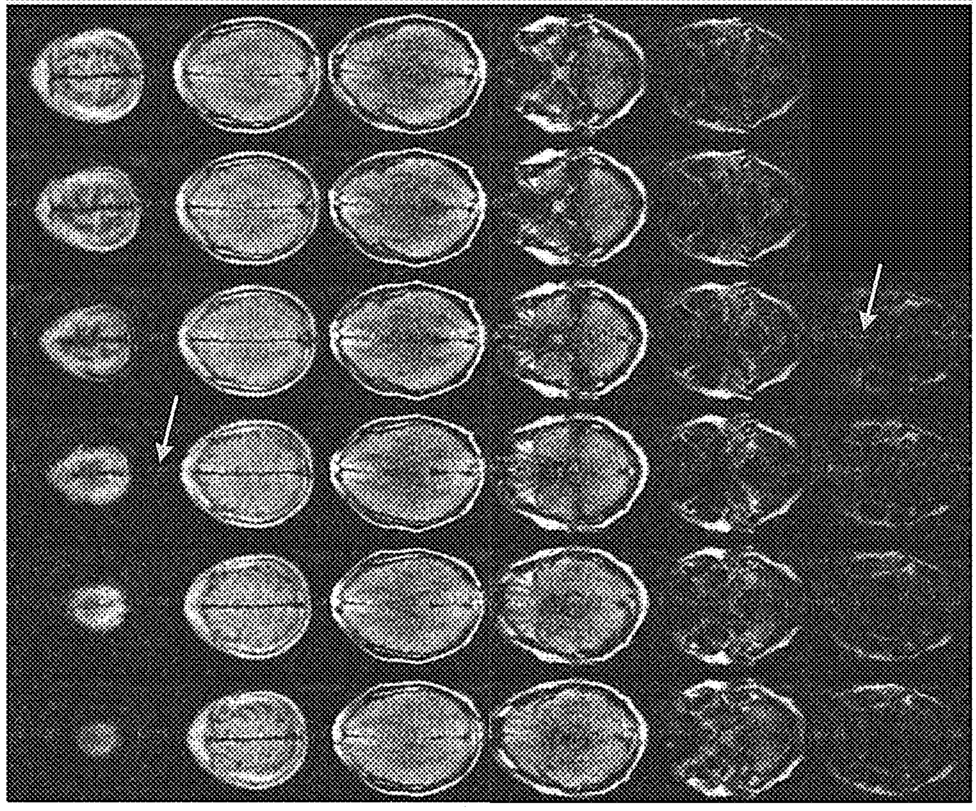
FIG. 14A shows MR images of a subject's brain, the MR images including narrowband EMI caused by magnetostriction effects, in accordance with some embodiments.

FIG. 14A shows MR images of a subject's brain, the MR images including narrowband EMI caused by magnetostriction effects. As described herein, magnetostriction may cause coherent line noise that may be synchronized with the time and phase of RF pulses transmitted by the MRI system. Because this noise is coherent with RF pulse transmission, and not spin echo MR signal as described in connection with FIGS. 2-4, a transformation may be applied to amplify the EMI signal and to suppress the spin echo MR signal. The transformation may transform the data into the frame of the RF transmit phase. In some embodiments, for multi-spin echo sequences, the frame of the RF transmit phase may be different from the frame of the RF receive phase. The transformation may be described by:

$$S_{tx} = e^{-i(tx-adc)} S_{aq},$$

where tx and adc are the phase of the transmit RF pulse and the phase of the RF receiver, respectively, and $S_{aq}$ and $S_{tx}$ are the observed and transformed data, respectively.

Because magnetostriction noise may be coherent in $S_{tx}$ across repetition period echo trains, the magnetostriction noise may be collected most coherently by applying a fast Fourier transform (FFT) along the repetition periods. In this domain, the magnetostriction EMI signal may be coherent and accumulates at the zero-frequency bin along the repetition period FFT. The selection criteria for this EMI may be set far higher than for incoherent EMI, because the coherent EMI may be consistent throughout the full acquisition. Thus, coherent EMI may be identified based on the following threshold value:

$$y_{n_{tx}} > \mu_{y_{tx}} + \theta_2 \sigma_{y_{tx}},$$

where $y_{n_{tx}}$ is the $S_{tx}$ data at index $n_{tx}$ and $\mu_{y_{tx}}$ and $\sigma_{y_{tx}}$ are the corresponding mean and standard deviations, respectively, and $\theta_2$ is pre-defined threshold. Once frequency bins including MR data affected by coherent EMI are identified, the coherent EMI may be suppressed as described herein. FIG. 14B shows the MR images of FIG. 14A after the narrowband EMI due to magnetostriction effects are suppressed, according to some embodiments.

Figure 15:
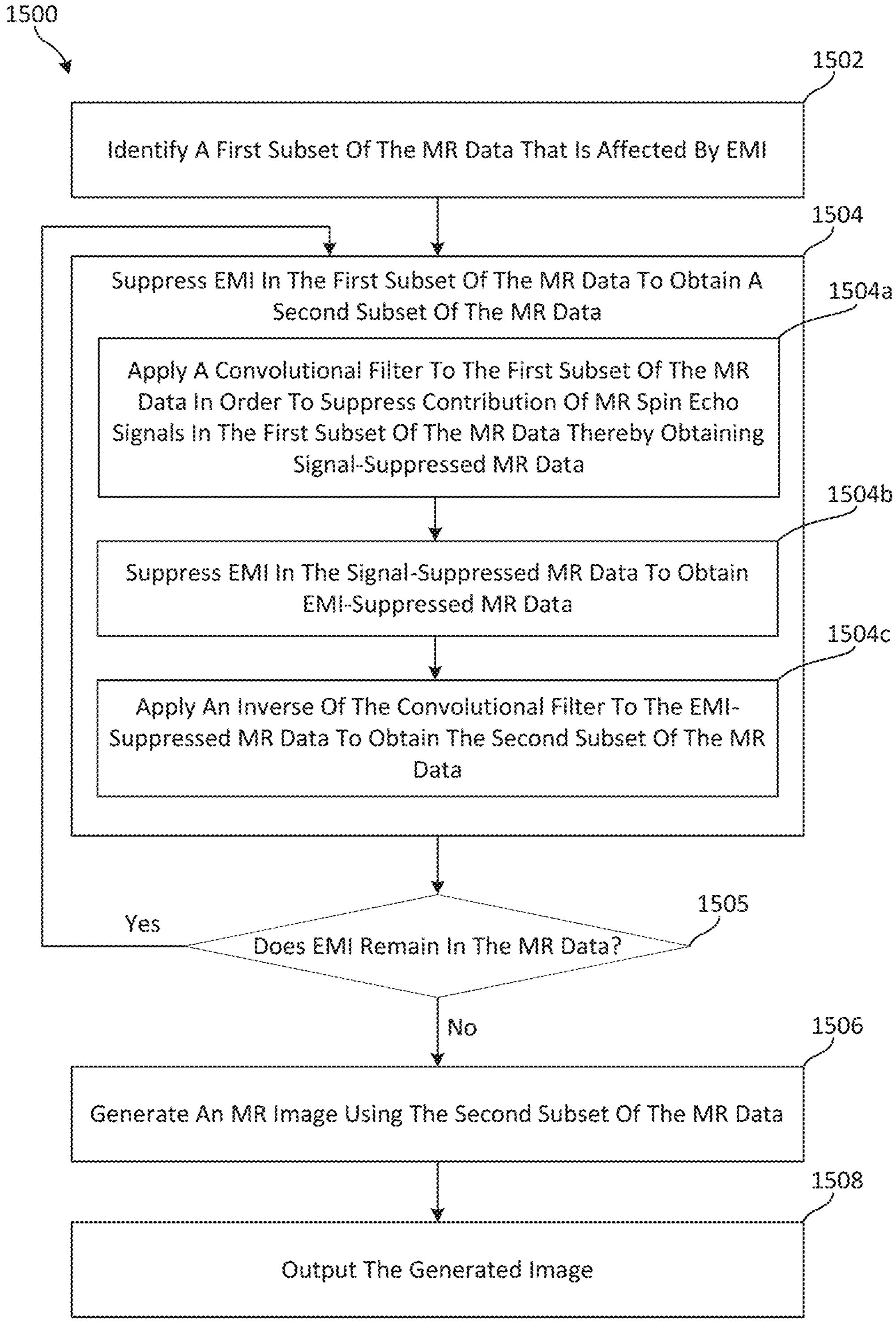
FIG. 15 illustrates a flowchart of a process for suppressing EMI in an MR image, in accordance with some embodiments.

FIG. 15 illustrates a flowchart of a process 1500 for suppressing EMI in an MR image, in accordance with some embodiments of the technology described herein. The process 1500 may be executed using any suitable computing device. For example, in some embodiments, the process 1500 may be performed by a computing device co-located (e.g., in the same room) with an MRI system that obtained the MR data by imaging a subject. As another example, in some embodiments, the process 1500 may be performed by one or more processors located on the MRI system that obtained the MR data. Alternately, in some embodiments, the process 1500 may be performed by one or more processors located remotely from the MRI system (e.g., as part of a cloud computing environment) that obtained the MR data.

In some embodiments, process 1500 may optionally include, before identifying a first subset of the MR data affected by EMI, generating the MR data. Generating the MR data may include operating the MRI system in accordance with a spin echo pulse sequence. For example, the MRI system may be operated in accordance with a spin echo pulse sequence selected from a group consisting of a T1 pulse sequence, a T2 pulse sequence, a fluid-attenuated inversion recovering (FLAIR) pulse sequence, and a diffusion weighted imaging (DWI) pulse sequence.

In some embodiments, process 1500 may optionally include, after generating the MR data and before identifying the first subset of MR data, suppressing EMI in the MR data that is detected by an auxiliary sensor and/or coil of the MRI system. The auxiliary sensor(s) may be any suitable auxiliary sensor(s), as described herein. The auxiliary sensor(s) may be arranged to detect EMI generated by EMI sources located near or within the field of view of the MRI system.

In some embodiments, suppressing EMI in the MR data may include estimating a transfer function of the auxiliary sensor(s) to more accurately estimate the noise detected by the RF coils. As a result, subtracting the noise signal measured by the auxiliary sensor(s) may not adequately suppress noise detected by the RF coils. In some embodiments, a transfer function of the auxiliary sensor(s) may be estimated and used to transform a noise signal received via the auxiliary sensor(s) to an estimate of the noise received by the RF coils. In some embodiments, broadband EMI suppression may include: obtaining samples of noise by using one or more auxiliary sensor(s); obtaining samples of the MR data using the primary RF coil; obtaining a transfer function; transforming the noise samples using the transfer function; and subtracting the transformed noise samples from the obtained MR data to suppress and/or eliminate noise.

In some embodiments, process 1500 may begin with an act 1502 of identifying a first subset of the MR data that may be affected by EMI. Identifying the first subset of the MR data may include identifying data in a single frequency bin or a set of neighboring frequency bins of the MR data that may be affected by EMI. In some embodiments, identifying the first subset of the MR data may include determining whether data in the one frequency bin or in the set of neighboring frequency bins may have a magnitude greater than a threshold value. In some embodiments, the threshold value may be determined based on the mean and/or standard deviation of the magnitude of the MR data.

In some embodiments, the portions of MR data affected by EMI may be identified using one or more methods of measuring external and/or internal EMI. In some embodiments, noise data acquisition may be performed using noise acquisition blocks placed before and/or after MR signal acquisition blocks of a pulse sequence. The noise acquisition blocks may be configured to acquire noise data including EMI caused by external and/or internal sources of EMI.

In some embodiments, the portions of MR data affected by EMI may be identified using one or more advanced peak picking algorithms. In some embodiments, Bayesian peak picking, non-negative matrix factorization, and/or undecimated discrete wavelet transform (UDWT) techniques may be used to identify the portions of MR data affected by EMI.

In some embodiments, the portions of MR data affected by EMI may be identified using only a portion of the MR data. In some embodiments, one or more subsets of the repetition periods of the MR data acquisition may be used to identify the portions of the MR data affected by EMI.

In some embodiments, identifying the first subset of the MR data may be performed by analyzing a portion of the MR data acquired during echo signals at an end of a repetition period of a pulse sequence used to acquire the MR data. The echoes at the end of the spin echo trains may acquire MR data from the outer edges of k-space, where a contribution to the MR data from the spin echo signals generated by the subject may be small or vanishing. In some embodiments, identifying the first subset of the MR data may be performed by analyzing the last two echo signals at the end of a repetition period of the pulse sequence used to acquire the MR data.

In some embodiments, where the EMI includes coherent EMI (e.g., due to magnetostriction, RF transmission electronics, etc.), determining the first subset of the MR data may include transforming the MR data into a reference frame of the transmitted pulses. Thereafter, determining the first subset of the MR data may include identifying whether MR data in a frequency bin or in a set of neighboring frequency bins may have a magnitude greater than a threshold value. Additional aspects of identifying coherent EMI are described herein.

In some embodiments, after identifying the first subset of the MR data, the process 1500 may proceed with an act 1504 of suppressing EMI in the first subset of the MR data to obtain a second subset of the MR data. Suppressing EMI in the first subset of the MR data may begin with a sub-act 1504*a* of applying a convolutional filter to the first subset of the MR data, in some embodiments. The convolutional filter may be configured to suppress contribution of MR spin echo signals in the first subset of the MR data and to thereby obtain signal-suppressed MR data. In some embodiments, the convolutional filter may be adapted to compensate for a spin echo MR signal that is not centered in the acquisition window, as described herein.

In some embodiments, the EMI may be present in an $n^{th}$ frequency bin of the plurality of frequency bins containing the MR data. In some embodiments, applying the convolutional filter to the first subset of MR data may include computing a weighted linear combination of data in multiple frequency bins, including the $n^{th}$ frequency bin, with the weights determined by coefficients of the convolutional filter. In some embodiments, computing the weighted linear combination of data in multiple frequency bins may include computing a weighted linear combination of data in the $n^{th}$ frequency bin and neighboring frequency bins (e.g., the $(n\pm1)^{th}$ bin, the $(n\pm2)^{th}$ bin, etc.).

In some embodiments, the EMI may be present in a number of neighboring frequency bins (e.g., the EMI may have a width greater than a single frequency bin). In some embodiments, applying the convolutional filter to the first subset of the MR data may include applying a convolutional filter having a length equal to either a number of the neighboring frequency bins of the plurality of neighboring frequency bins, if the number of neighboring frequency bins is even, or a number one greater than the number of the neighboring frequency bins of the plurality of neighboring frequency bins, if the number of the neighboring frequency bins is odd.

After applying the convolutional filter to the first subset of the MR data, the process 1000 may proceed with suppressing EMI in the signal-suppressed MR data to obtain EMI-suppressed MR data 1004*b*. In some embodiments, suppressing the EMI in the signal-suppressed MR data may include using an SVD to obtain the EMI-suppressed MR data. In some embodiments, suppressing the EMI in the signal-suppressed MR data may include determining an SVD of the signal-suppressed MR data, modifying the SVD by setting at least one singular value of the SVD to zero, and obtaining the respective EMI-suppressed MR data using the modified SVD. In some embodiments, modifying the SVD may include setting a first singular value of the SVD to zero, setting a first few singular values of the SVD to zero, and/or setting some singular values of the SVD to zero. After suppressing EMI in the signal-suppressed MR data, the process 1500 may proceed with applying an inverse of the convolutional filter to the EMI-suppressed MR data to obtain the second subset of the MR data 1004*c*.

In some embodiments, the first subset of the MR data may include a plurality of data portions for a respective plurality of frequency bins. In some embodiments, where the MRI system includes multiple RF coils, each data portion may include measurements made by each of the RF coils in each respective frequency bin. In some embodiments, data in the respective signal-suppressed data portion may be organized as an $N_c \times M$ matrix, where Ne may be an integer representing the number of RF coils and M may be an integer representing the number of measurements made by each of the RF coils. Determining the SVD of the respective-signal suppressed MR data portion may then include determining a singular value decomposition of the $N_c \times M$ matrix.

In some embodiments, the first subset of the MR data may include a plurality of data portions for a respective plurality of frequency bins, and suppressing the EMI in the first subset of the MR data may include performing the described acts 1504*a*-1504*c* for each particular data portion in the plurality of data portions. In some embodiments, suppressing the EMI in the first subset of the MR data may include applying the convolutional filter to the particular data portion to obtain a respective signal-suppressed MR data portion, suppressing EMI in the respective signal-suppressed MR data portion to obtain a respective EMI-suppressed MR data portion, and applying the inverse of the convolutional filter to the EMI-suppressed MR data portion. In some embodiments, suppressing EMI in the respective signal-suppressed MR data portion may include determining an SVD of the respective signal-suppressed MR data portion, modifying the SVD by setting at least one singular value of the SVD to zero, and obtaining the respective EMI-suppressed MR data portion using the modified SVD.

After obtaining the second subset of the MR data, the process 1500 may proceed with determining whether EMI remains in the MR data 1005. Determining whether EMI remains in the MR data may be performed in substantially the same way as identifying the first subset of the MR data that is affected by EMI in the first act 1502 of the process 1500. If it is determined that there may still be EMI in the MR data, the process 1500 may return to perform additional EMI suppression. In this manner, the process 1500 may iteratively suppress EMI in the MR data until all EMI has a magnitude below a threshold value. In some embodiments, the process 1500 may iteratively suppress EMI in the MR data until all EMI has a magnitude below a threshold value determined based on a standard deviation of the MR data, as described herein.

In some embodiments, once the EMI has been sufficiently suppressed, the process 1500 may proceed with an act 1506 of generating an MR image using the second subset of the MR data. In some embodiments, generating the MR image using the modified MR data may include modifying the MR data by replacing the first subset of the MR data with the second subset of the MR data to obtain modified MR data. The MR image may then be generated using the modified MR data.

In some embodiments, generating the MR image may be implemented using any suitable image reconstruction techniques arranged to reconstruct the image from the spatial frequency domain to the image domain. Image reconstruction may be performed using any suitable image reconstruction techniques, including but not limited to linear and/or non-linear reconstruction techniques. In some embodiments, image reconstruction may be performed using one or more of a fast Fourier transform (FFT), a non-uniform Fourier transform, gridding, principal component analysis (PCA), sensitivity encoding (SENSE), conjugate gradient sensitivity encoding (CG-SENSE), generalized autocalibrating partial parallel acquisition (GRAPPA), compressed sensing (CS), and/or deep learning techniques.

In some embodiments, after generating the MR image, the process 1500 may proceed with outputting the generated MR image 1008. In some embodiments, outputting the generated image may include displaying the generated MR image. In some embodiments, the generated MR image may be displayed on a screen associated with a desktop or laptop computer, a television monitor, a tablet, a smartphone, or any other suitable electronic device. In some embodiments, outputting the generated image may include transmitting the generated MR image to another computing device. For example, the generated MR image may be transmitted over a network (e.g., a local area network (LAN) or wide area network (WAN)) or over the internet (e.g., in an electronic message such as an e-mail and/or an SMS). In some embodiments, outputting the generated MR message may include storing the generated MR image in a computer memory. In some embodiments, the generated MR message may be stored locally, on computer memory of the computer generating the MR image, or remotely, on computer memory located remotely from the computer generating the MR image. In some embodiments, the generated MR image may be stored on an image server, such as a DICOM server or a patient database server.

Figure 16:
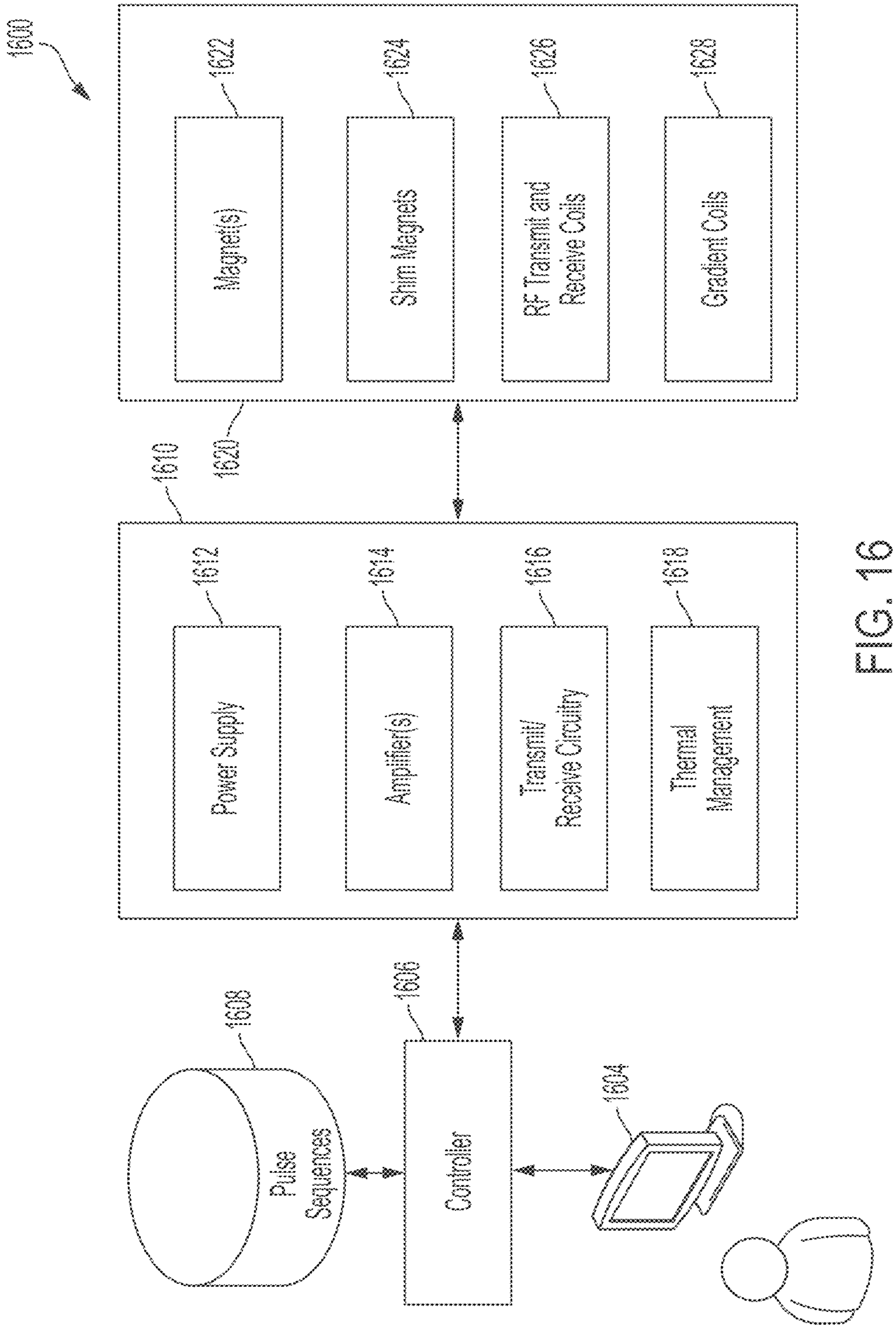
FIG. 16 illustrates components of an MRI system, in accordance with some embodiments.

FIG. 16 is a block diagram of typical components of an MRI system 1600. In the illustrative example of FIG. 16, MRI system 1600 comprises computing device 1604, controller 1606, pulse sequences store 1608, power management system 1610, and magnetics components 1620. It should be appreciated that MRI system 1600 is illustrative and that an MRI system may have one or more other components of any suitable type in addition to or instead of the components illustrated in FIG. 16. However, an MRI system will generally include these high-level components, though the implementation of these components for a particular MRI system may differ. It may be appreciated that the techniques described herein for suppressing EMI may be used with any suitable type of MRI systems including high-field MRI systems, low-field MRI systems, and ultra-low field MRI systems. In some implementations, a magnetic shielding paint to reduce magnetic noise may be applied to one or more portions of the MRI system 1600 to reduce magnetic noise from one or more external sources.

As illustrated in FIG. 16, magnetics components 1620 comprise $B_0$ magnet 1622, shim magnets 1624, radio frequency (RF) transmit and receive coils 1626, and gradient coils 1628. $B_0$ magnets 1622 may be used to generate the main magnetic field $B_0$. $B_0$ magnets 1622 may be any suitable type or combination of magnetics components that can generate a desired main magnetic $B_0$ field. In some embodiments, $B_0$ magnets 1622 may be a permanent magnet, an electromagnet, a superconducting magnet, or a hybrid magnet comprising one or more permanent magnets and one or more electromagnets and/or one or more superconducting magnets. In some embodiments, $B_0$ magnets 1622 may be configured to generate a $B_0$ magnetic field having a field strength that is less than or equal to 0.2 T and greater than or equal to 20 mT, less than or equal to 0.2 T and greater than or equal to 50 mT, less than or equal to 0.15 T and greater than or equal to 40 mT, less than or equal to 0.1 T and greater than or equal to 20 mT, or less than or equal to 0.1 T and greater than or equal to 50 mT.

In some embodiments, $B_0$ magnets 1622 may include a first and second $B_0$ magnet, each of the first and second $B_0$ magnet including permanent magnet blocks arranged in concentric rings about a common center. The first and second $B_0$ magnet may be arranged in a bi-planar configuration such that the imaging region is located between the first and second $B_0$ magnets. In some embodiments, the first and second $B_0$ magnets may each be coupled to and supported by a ferromagnetic yoke configured to capture and direct magnetic flux from the first and second $B_0$ magnets.

Gradient coils 1628 may be arranged to provide gradient fields and, for example, may be arranged to generate gradients in the $B_0$ field in three substantially orthogonal directions (X, Y, Z). Gradient coils 1628 may be configured to encode emitted MR signals by systematically varying the $B_0$ field (the $B_0$ field generated by magnet 1622 and/or shim magnets 1624) to encode the spatial location of received MR signals as a function of frequency or phase. In some embodiments, gradient coils 1628 may be configured to vary frequency or phase as a linear function of spatial location along a particular direction, although more complex spatial encoding profiles may also be provided by using nonlinear gradient coils. In some embodiments, gradient coils 1628 may be implemented using laminate panels (e.g., printed circuit boards).

MRI may be performed by exciting and detecting emitted MR signals using transmit and receive coils, respectively (often referred to as radio frequency (RF) coils). Transmit/receive coils 1626 may include separate coils for transmitting and receiving, multiple coils for transmitting and/or receiving, or the same coils for transmitting and receiving. Thus, a transmit/receive component may include one or more coils for transmitting, one or more coils for receiving and/or one or more coils for transmitting and receiving. Transmit/receive coils 1626 are also often referred to as Tx/Rx or Tx/Rx coils to generically refer to the various configurations for the transmit and receive magnetics component of an MRI system. These terms are used interchangeably herein. In FIG. 16, RF transmit and receive coils 1626 comprises one or more transmit coils that may be used to generate RF pulses to induce an oscillating magnetic field $B_1$. The transmit coil(s) may be configured to generate any suitable types of RF pulses. The transmit and receive coils 1626 may include additional electronic components of the transmit and receive chains.

Power management system 1610 may include electronics to provide operating power to one or more components of the MRI system 1600. In some embodiments, power management system 1610 may include one or more power supplies, gradient power components, transmit coil components, and/or any other suitable power electronics needed to provide suitable operating power to energize and operate components of MRI system 1600. Power management system 1610 may include power supply 1612, amplifier(s) 1614, transmit/receive circuitry 1616, and thermal management components 1618 (e.g., cryogenic cooling equipment for superconducting magnets, or fluid cooling equipment for electromagnets and/or circuitry). Power supply 1612 may include electronics to provide operating power to magnetics components 1620 of the MRI system 1600. In some embodiments, power supply 1612 may include electronics to provide operating power to one or more $B_0$ coils (e.g., $B_0$ magnet 1622) to produce the main magnetic field for the low-field MRI system. The power management system 1610 may receive power from a standard wall outlet to provide power to the MRI system 1600, in a non-limiting example.

Amplifier(s) 1614 may include one or more RF receive (Rx) pre-amplifiers that amplify MR signals detected by one or more RF receive coils (e.g., coils 1626), one or more RF transmit (Tx) power components configured to provide power to one or more RF transmit coils (e.g., coils 1626), one or more gradient power components configured to provide power to one or more gradient coils (e.g., gradient coils 1628), and one or more shim power components configured to provide power to one or more shim coils (e.g., shim magnets 1624). Transmit/receive circuitry 1616 may be configured to select whether RF transmit coils or RF receive coils are being operated (e.g., using a switch or switches).

As illustrated in FIG. 16, MRI system 1600 includes controller 1606 (also referred to as a console) having control electronics to send instructions to and receive information from power management system 1610. Controller 1606 may be configured to implement one or more pulse sequences, which are used to determine the instructions sent to power management system 1610 to operate the magnetics components 1620 in a desired sequence (e.g., parameters for operating the RF transmit and receive coils 1626, parameters for operating gradient coils 1628, etc.). In some embodiments, controller 1606 also interacts with computing device 1604 programmed to process received MR data. In some embodiments, computing device 1604 may process received MR data to generate one or more MR images using any suitable image reconstruction process(es). Controller 1606 may provide information about one or more pulse sequences to computing device 1604 for the processing of data by the computing device. In some embodiments, controller 1606 may provide information about one or more pulse sequences to computing device 1604 and the computing device may perform an image reconstruction process based, at least in part, on the provided information.

Figure 17:
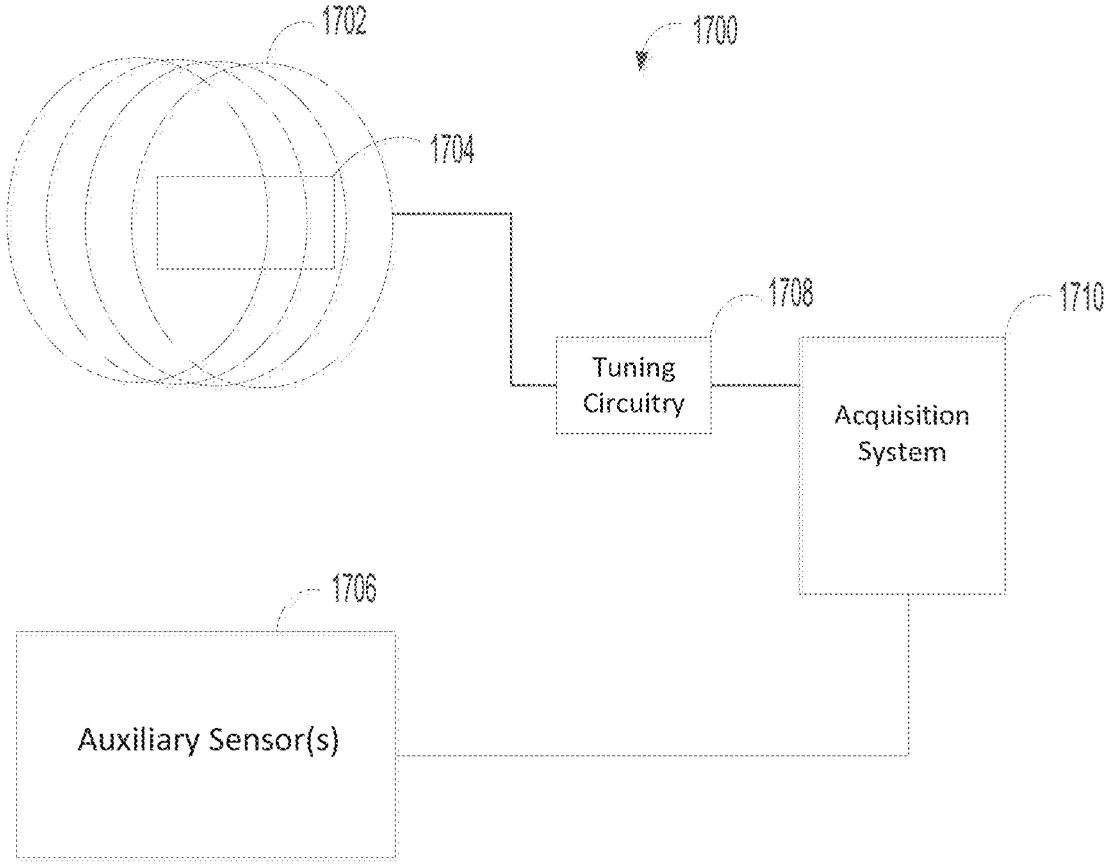
FIG. 17 illustrates components of an MRI system used for performing noise suppression, in accordance with some embodiments.

FIG. 17 shows illustrative components of a portion of an MRI system that may be used for performing broadband EMI suppression, in accordance with some embodiments described herein. In some embodiments, transmit/receive system 1700 may form at least part of the transmit/receive equipment of an MRI system. Transmit/receive system 1700 may be configured to detect MR signals emitted from excited atoms of a subject 1704 being imaged, and to characterize noise in the environment to suppress or remove the characterized noise from the detected MR signals, as discussed herein.

As shown in FIG. 17, transmit/receive system 1700 may include a primary RF receive coil 1702 configured to measure MR signals emitted by the subject 1704 in response to an excitation pulse sequence. The excitation pulse sequence may be produced by primary RF receive coil 1702 and/or by one or more other transmit RF coils arranged proximate subject 1704 and configured to produce suitable MR pulse sequences when operated. Primary receive coil 1702 may be a single coil or may be a plurality of coils, which, in the latter case, may be used to perform parallel MRI. Tuning circuitry 1708 may facilitate operation of primary receive coil 1702 and signals detected by RF coil(s) 1702 may be provided to acquisition system 1710, which may amplify the detected signals, digitize the detected signals, and/or perform any other suitable type of processing.

Transmit/receive system 1700 may also include auxiliary sensor(s) 1706, which may include any number or type of sensor(s) configured to detect or otherwise measure noise sources in the environment and/or environmental noise produced by the MRI system itself. The noise measured by auxiliary sensor(s) 1706 may be characterized and used to suppress noise in the MR signal detected by primary RF coil(s) 1702 using techniques described herein. In some embodiments, after acquisition system 1710 processes the signals detected by RF coil(s) 1702 and auxiliary sensor(s) 1706, acquisition system 1710 may provide the processed signals to one or more other components of the MRI system for further processing (e.g., for use in forming one or more MR images of subject 1704). The acquisition system 1710 may comprise any suitable circuitry and may comprise, for example, one or more controllers and/or processors configured to control the MRI system to perform noise suppression in accordance with embodiments described herein.

In some embodiments, auxiliary sensor(s) 1706 may include one or more auxiliary coils configured to measure noise from one or more noise sources in the environment in which the MRI system is operating. In some embodiments, primary RF coil(s) 1702 may include eight primary RF coils, and auxiliary sensor(s) 1706 may include eight auxiliary coils, though it should be appreciated that the number of primary RF coil(s) 1702 and the number of auxiliary sensor(s) 1706 could be less than or greater than eight (e.g., 2, 4, 6, 10, 12, 14, and/or 16), and that the number of primary RF coil(s) 1702 and the number of auxiliary sensor(s) 1706 need not be equal, as the technology described herein is not limited in this respect.

In some embodiments, the auxiliary RF coil(s) may be constructed to be substantially more sensitive to ambient noise than to any noise generated by the coil itself. For example, the auxiliary RF coil may have a sufficiently large aperture and/or a number of turns such that the auxiliary coil may be more sensitive to noise from the environment than to noise generated by the auxiliary coil itself. In some embodiments, auxiliary RF coil(s) may have a larger aperture and/or a greater number of turns than primary RF coil(s) 1702. However, auxiliary RF coil(s) may be the same as primary RF coil in this respect and/or may differ from primary RF coil(s) 1702 in other respects.

In some embodiments, auxiliary RF coil(s) may be located a distance apart from primary RF coil 1702. The distance may be selected such that auxiliary coil(s) is/are sufficiently far away from the sample 1704 to avoid sensing MR signals emitted by the sample during imaging, but otherwise arranged as close as possible to the primary RF coil 1702 so that auxiliary coil(s) detect noise similar to the noise detected by primary coil(s) 1702. In this manner, the noise from one or more noise sources measured by auxiliary coil(s) 1706 and characterized using techniques discussed herein (e.g., by using the detected noise to calculate, at least in part, a transfer function that can be used to suppress and/or eliminate noise present on detected MR signals) may be representative of the noise detected by primary coil(s) 1702. In some embodiments, the auxiliary coil(s) may not be RF coils but may be any type of sensor capable of detecting or measuring noise in the environment that may impact the performance of the MRI system.

According to some embodiments, auxiliary sensor(s) 1706 may include the primary coil(s) itself, wherein the primary RF coil(s) are labeled both as primary receive coil 1702 and auxiliary sensor 1706 for the system, as the primary RF coil(s) may perform both roles in some circumstances. As discussed herein, certain pulse sequences may facilitate using the signals acquired from the primary coil(s) to also suppress noise thereon. A pulse sequence refers generally to operating transmit coil(s) and gradient coil(s) in a prescribed sequence to induce an MR response. By repeating the same pulse sequence using the same spatial encoding, "redundant" MR signals may be obtained and used to estimate noise present in the MR signals.

Figure 18:
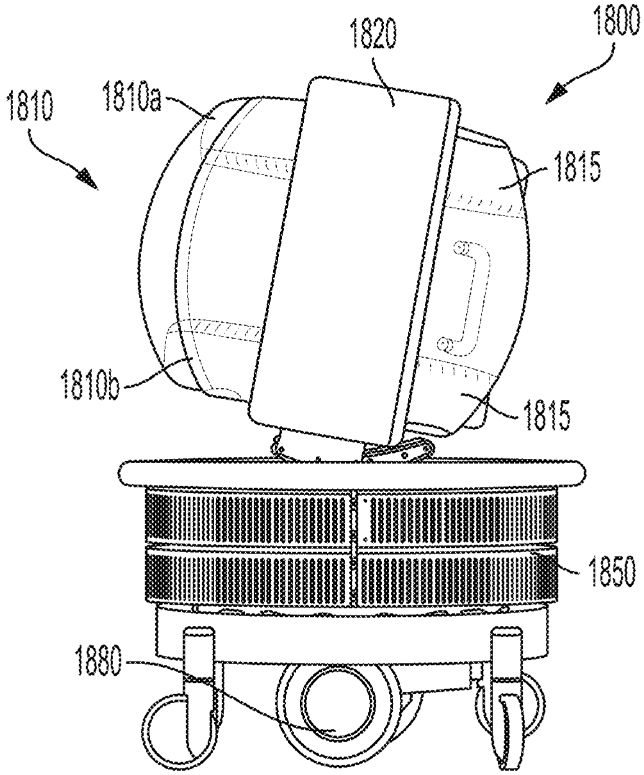
FIG. 18 illustrates an MRI system, in accordance with some embodiments.

FIG. 18 illustrates an MRI system 1800 that may be used to acquire MR images of a subject, in accordance with some embodiments. MRI system 1800 may include a $B_0$ magnet 1810 formed in part by an upper magnet 1810*a* and a lower magnet 1810*b* having a yoke 1820 coupled thereto to increase the flux density within the imaging region. The $B_0$ magnet 1810 may be housed in magnet housing 1812 along with gradient coils 1815. According to some embodiments, $B_0$ magnet 1810 may include an electromagnet. According to some embodiments, $B_0$ magnet 1810 may include a permanent magnet.

MRI system 1800 may further include a base 1850 housing the electronics needed to operate the MRI system. In some embodiments, base 1850 may house electronics including power components configured to operate the MRI system 1800 using mains electricity (e.g., via a connection to a standard wall outlet and/or a large appliance outlet). In some embodiments, MRI system 1800 can be brought to the patient and plugged into a wall outlet in the vicinity.

Figure 19:
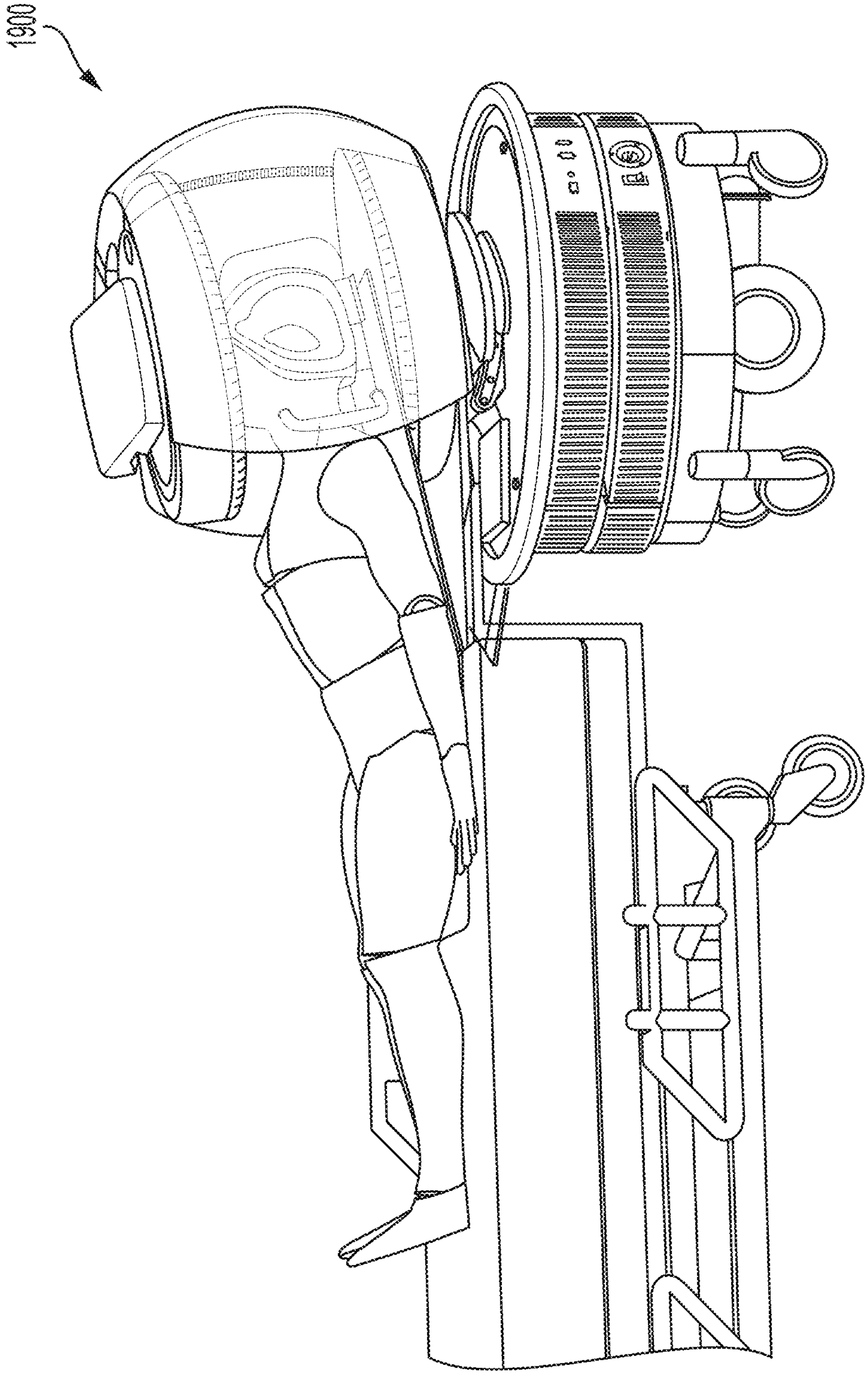
FIG. 19 illustrates a portable MRI system, in accordance with some embodiments.

The base 1850 may be supported by transportation mechanism 1880. Transportation mechanism 1880, as shown in FIG. 18, may include wheels enabling the movement of MRI system 1800. In some embodiments, the transportation mechanism 1880 may include motorized wheels configured to assist a user in the transportation of MRI system 1800. In this manner, MRI system 1800 may be transported to the patient and maneuvered to the bedside to perform imaging. FIG. 19 shows an MRI system 1900 that has been transported to a patient's bedside to perform a brain scan.

Figure 20:
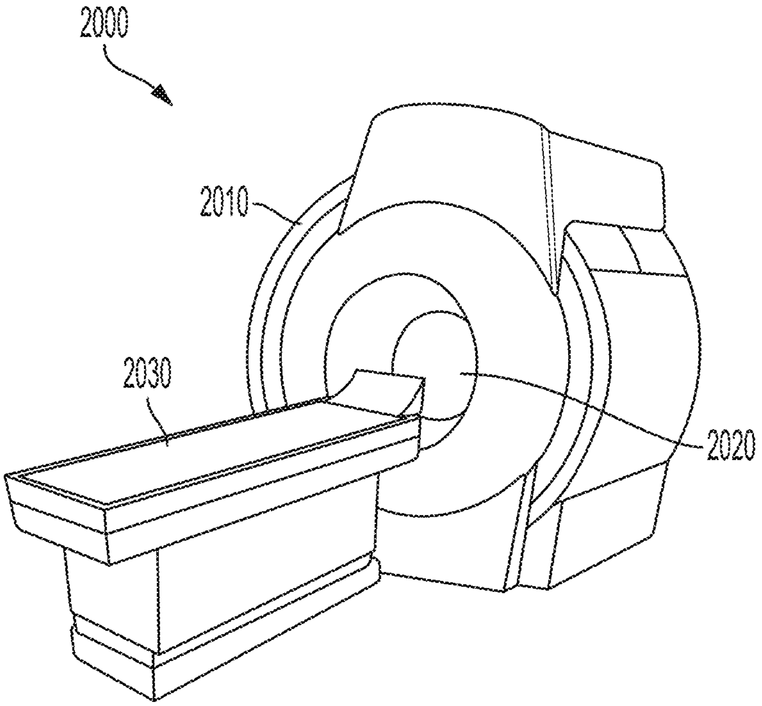
FIG. 20 illustrates an alternative MRI system, in accordance with some embodiments.

FIG. 20 illustrates an alternative MRI system 2000 that may be used to acquire MR images of a subject, in accordance with some embodiments. MRI system 2000 may include a housing 2010, which may house a $B_0$ magnet having a bore 2020. The imaging region may be located within the bore 2020. In some embodiments, the subject may be placed on subject support 2030 and slid into the bore 2020 in order to be placed within the imaging region of the MRI system 2000. In some embodiments, the $B_0$ magnet may include a superconducting magnet. In some embodiments, the $B_0$ magnet may include an electromagnet. In some embodiments, the $B_0$ magnet may generate a magnetic field having a strength in the range of 0.2-0.5 T, 0.5-1.5 T, 1.5-3 T, 2-4 T, or greater than 4 T. In some embodiments, MRI system 2000 may be a high-field system.

Figure 21:
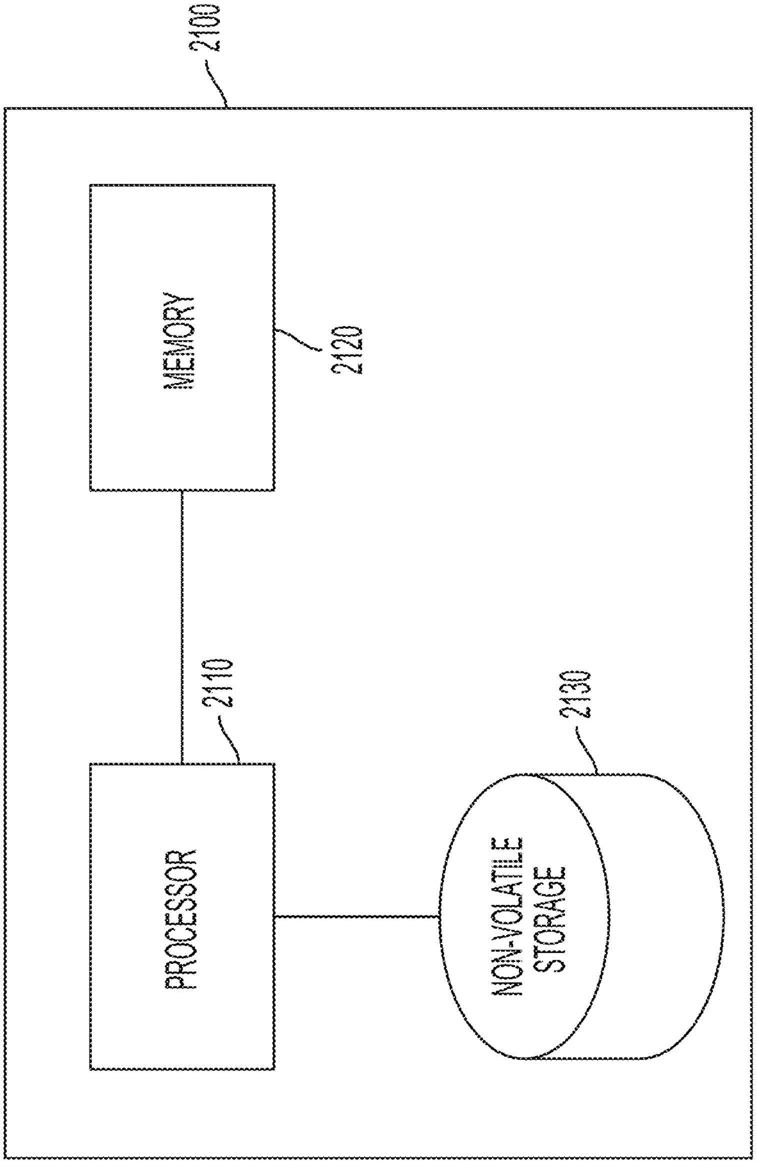
FIG. 21 is a diagram of an illustrative computer system, in accordance with some embodiments.

FIG. 21 is a diagram of an illustrative computer system on which embodiments described herein may be implemented. An illustrative implementation of a computer system 2100 that may be used in connection with any of the embodiments of the disclosure provided herein is shown in FIG. 21. In some embodiments, any one of the processes described herein may be implemented on and/or using the computer system 2100. The computer system 2100 may include one or more processors 2110 and one or more articles of manufacture that comprise tangible (e.g., non-transitory) computer-readable storage media (e.g., memory 2120 and one or more non-volatile storage media 2130). The processor 2110 may control writing data to and reading data from the memory 2120 and the non-volatile storage device 2130 in any suitable manner. To perform any of the functionality described herein, the processor 2110 may execute one or more processor-executable instructions stored in one or more non-transitory computer-readable storage media (e.g., the memory 2120), which may serve as non-transitory computer-readable storage media storing processor-executable instructions for execution by the processor 2110.

Example 1

In an illustrative embodiment, EMI suppression may be implemented in connection with a low-field MRI system. The low-field MRI system may include a $B_0$ magnet configured to generate a $B_0$ magnetic field having a magnetic field strength in a range from 0.05 T to 0.2 T. The $B_0$ magnet may include permanent magnets arranged in one or more concentric rings. The low-field MRI system may have an open configuration in which the permanent magnets may be arranged in a bi-planar configuration such that an imaging region is disposed therebetween. The low-field MRI system may further include one or more gradient coils. The low-field MRI system may further include one or more RF coils. In addition to the one or more RF coils, the low-field MRI system may include one or more auxiliary sensors configured to detect EMI. The auxiliary sensors may be positioned outside of the field of view of the low-field MRI system so that they primarily detect noise external to the low-field MRI system rather than MR signal generated during imaging with the low-field MRI system. The low-field MRI system may be located outside of a shielded room, inside a partially shielded room, or inside a fully shielded room. The low-field MRI system may be portable and may be transported to different locations where it may be used.

Suppression of EMI may be performed by acquiring MR data using the low-field MRI system. A first subset of the MR data in one or more frequency bins of the MR data may be identified as including EMI based on portions of the data acquired near or at the edge of k-space. A convolutional filter may be applied to the first subset of the MR data to suppress the spin echo MR signal in the first subset of the MR data and to obtain signal-suppressed MR data. An SVD of the signal-suppressed MR data may be determined, and the first singular value of the SVD may be set to zero to obtain a modified SVD. The modified SVD may be used to obtain an EMI-suppressed MR data, and the inverse of the convolutional filter may be applied to the EMI-suppressed MR data to obtain a second subset of the MR data. The first subset of the MR data may be replaced by the second subset of the MR data, and the modified MR data may be used to generate an MR image. The MR image may be output (e.g., displayed, transmitted, and/or stored in computer memory) after being generated.

Example 2

In another illustrative embodiment, EMI suppression may be implemented in connection with a high-field MRI system. The high-field MRI system may include a $B_0$ magnet configured to generate a $B_0$ magnetic field having a magnetic field strength in a range from 1.0 T to 13.0 T. The $B_0$ magnet may include magnets arranged to form a bore such that the imaging region is disposed within the bore. The magnets may be electromagnets, superconducting magnets, or a combination of electromagnets and superconducting magnets. The high-field MRI system may be located in a shielded room or a partially shielded room.

Suppression of EMI may be performed by acquiring MR data using the high-field MRI system. A first subset of the MR data in one or more frequency bins of the MR data may be identified as including EMI based on portions of the data acquired near or at the edge of k-space. A convolutional filter may be applied to the first subset of the MR data to suppress the spin echo MR signal in the first subset of the MR data and to obtain signal-suppressed MR data. An SVD of the signal-suppressed MR data may be determined, and the first singular value of the SVD may be set to zero to obtain a modified SVD. The modified SVD may be used to obtain an EMI-suppressed MR data, and the inverse of the convolutional filter may be applied to the EMI-suppressed MR data to obtain a second subset of the MR data. The first subset of the MR data may be replaced by the second subset of the MR data, and the modified MR data may be used to generate an MR image. The MR image may be output (e.g., displayed, transmitted, and/or stored in computer memory) after being generated.

Example 3

In another illustrative embodiment, EMI suppression may be implemented in connection with a low-field, mid-field, or high-field MRI system. The MRI system may include a $B_0$ magnet configured to generate a $B_0$ magnetic field having a magnetic field strength in a range from 0.02 T to 13 T. The $B_0$ magnet may include permanent magnets, electromagnets, and/or superconducting magnets arranged to form an imaging region. The MRI system may be located outside of a shielded room, inside a partially shielded room, or inside a fully shielded room.

Suppression of EMI may be performed by acquiring MR data using the MRI system. A first subset of the MR data in one or more frequency bins of the MR data may be identified as including EMI based on portions of the data acquired near or at the edge of k-space. A convolutional filter may be applied to the first subset of the MR data to suppress the spin echo MR signal in the first subset of the MR data and to obtain signal-suppressed MR data. An SVD of the signal-suppressed MR data may be determined, and the first singular value of the SVD may be multiplied by a number between 0 and 1 to obtain a modified SVD. The modified SVD may be used to obtain an EMI-suppressed MR data, and the inverse of the convolutional filter may be applied to the EMI-suppressed MR data to obtain a second subset of the MR data. The first subset of the MR data may be replaced by the second subset of the MR data, and the modified MR data may be used to generate an MR image. The MR image may be output (e.g., displayed, transmitted, and/or stored in computer memory) after being generated.

Furthermore, the present technology may be embodied in any of the following configurations:

(1) A method for suppressing electromagnetic interference (EMI) in magnetic resonance (MR) data obtained by a magnetic resonance imaging (MRI) system, the method comprising: using at least one computer hardware processor to perform: identifying a first subset of the MR data that is affected by EMI; suppressing EMI in the first subset of the MR data to obtain a second subset of the MR data by: applying a filter to the first subset of the MR data in order to suppress contribution of MR spin echo signals in the first subset of the MR data thereby obtaining signal-suppressed MR data; suppressing EMI in the signal-suppressed MR data to obtain EMI-suppressed MR data; and applying an inverse of the filter to the EMI-suppressed MR data to obtain the second subset of the MR data; generating an MR image using the second subset of the MR data; and outputting the generated MR image.

(2a) The method of (1), wherein suppressing the EMI in the signal-suppressed MR data comprises using component decomposition to obtain the EMI-suppressed MR data.

(2b) The method of (1), wherein suppressing the EMI in the signal-suppressed MR data comprises applying a domain transform to the signal-suppressed MR data, using component decomposition to obtain the EMI-suppressed MR data, and applying the inverse of the domain transform, where the domain transform and the EMI signal suppression may be applied iteratively.

(3) The method of (1) or (2a) or (2b), wherein the first subset of the MR data comprises a plurality of data portions for a respective plurality of frequency or time bins, and wherein suppressing the EMI in the first subset of the MR data comprises: for each particular data portion in the plurality of data portions, applying the filter to the particular data portion to obtain a respective signal-suppressed MR data portion; suppressing EMI in the respective signal-suppressed MR data portion to obtain a respective EMI-suppressed MR data portion; and applying the inverse of the filter to the EMI-suppressed MR data portion.

(4) The method of any one of (1) through (3), wherein suppressing EMI in the respective signal-suppressed MR data portion comprises: determining a component decomposition of the respective signal-suppressed MR data portion; modifying the SVD by setting at least one singular value of the component decomposition to a predetermined value or by multiplying at least one singular value of the component decomposition by a predetermined weight; and obtaining the respective EMI-suppressed MR data portion using the modified component decomposition.

(5) The method of any one of (1) through (4), wherein the MRI system comprises multiple radio frequency (RF) coils, and wherein each data portion, of the plurality of data portions, comprises measurements for its respective frequency or time bin, of the plurality of frequency or time bins, made by each of the multiple RF coils.

(6) The method of any one of (1) through (5), wherein data in the respective signal-suppressed data portion is organized as an $N_c$×M matrix, where Ne is an integer representing the number of RF coils and M is an integer representing the number of measurements made by each of the RF coils, and wherein determining the component decomposition of the respective-signal suppressed MR data portion comprises determining a singular value decomposition of the $N_c \times M$ matrix.

(7) The method of any one of (1) through (6), further comprising: before identifying the first subset of the MR data, generating the MR data by operating the MRI system in accordance with a spin echo or a gradient echo pulse sequence.

(8) The method of any one of (1) through (7), wherein the spin echo pulse sequence is selected from a group consisting of a T1 pulse sequence, a T2 pulse sequence, a fluid-attenuated inversion recovering (FLAIR) pulse sequence, and a diffusion weighted imaging (DWI) pulse sequence.

(9) The method of any one of (1) through (8), further comprising: after generating the MR data and before identifying the first subset, suppressing EMI in the MR data that is detected by an auxiliary coil of the MRI system.

(10) The method of any one of (1) through (9), wherein the EMI is narrowband EMI, and wherein the MR data comprises sensor domain data in a plurality of frequency or time bins, and wherein the EMI is present in a frequency or time bin of the plurality of frequency or time bins.

(11) The method of any one of (1) through (10), wherein the EMI is present in no more than a threshold number of neighboring frequency or time bins of the plurality of frequency or time bins.

(12) The method of any one of (1) through (11), wherein the EMI is present in an $n^{th}$ frequency or time bin of the plurality of frequency or time bins, and wherein applying the filter to the first subset of MR data comprises computing a weighted linear combination of data in multiple frequency or time bins, including the $n^{th}$ frequency or time bin, with the weights determined by coefficients of the filter.

(13) The method of any one of (1) through (12), wherein: the MR data comprises data in a plurality of frequency or time bins, the EMI is present in a plurality of neighboring frequency or time bins, and applying the filter to the first subset of the MR data comprises applying a filter having a length equal to at least a number of the neighboring frequency or time bins of the plurality of neighboring frequency or time bins.

(14) The method of any one of (1) through (13), wherein identifying the first subset of the MR data comprises identifying data in a single frequency or time bin or a set of neighboring frequency or time bins of the MR data that is affected by EMI.

(15) The method of any one of (1) through (14), wherein identifying the first subset of the MR data is performed by analyzing a portion of the MR data acquired during at least one predetermined echo signal of a pulse sequence used to acquire the MR data.

(16) The method of any one of (1) through (15), wherein identifying the first subset of the MR data comprises determining whether data in the one frequency or time bin or in the set of neighboring frequency or time bins has a magnitude greater than a threshold value.

(17) The method of any one of (1) through (16), wherein generating the MR image comprises: modifying the MR data by replacing the first subset of the MR data with the second subset of the MR data to obtain modified MR data; and generating the MR image using the modified MR data.

(18) The method of any one of (1) through (17), wherein the MRI system comprises radio frequency (RF) coils configured to transmit RF pulses, and wherein determining the first subset of the MR data comprises transforming the MR data into a reference frame of the transmitted RF pulses.

(19) A magnetic resonance imaging (MRI) system, comprising: a magnetics system having a plurality of magnetics components to produce magnetic fields for performing MRI by acquiring MR data; and at least one processor configured to perform: identifying a first subset of the MR data that is affected by electromagnetic interference (EMI); suppressing EMI in the first subset of the MR data to obtain a second subset of the MR data by: applying a filter to the first subset of the MR data in order to suppress contribution of MR spin echo signals in the first subset of the MR data thereby obtaining signal-suppressed MR data; suppressing EMI in the signal-suppressed MR data to obtain EMI-suppressed MR data; and applying an inverse of the filter to the EMI-suppressed MR data to obtain the second subset of the MR data; generating an MR image using the second subset of the MR data; and outputting the generated MR image.

(20) At least one tangible computer readable storage medium storing processor-executable instructions that, when executed by at least one processor, cause the at least one processor to perform a method for suppressing electromagnetic interference (EMI) in magnetic resonance (MR) data obtained by a magnetic resonance imaging (MRI) system, the method comprising: identifying a first subset of the MR data that is affected by EMI; suppressing EMI in the first subset of the MR data to obtain a second subset of the MR data by: applying a filter to the first subset of the MR data in order to suppress contribution of MR spin echo signals in the first subset of the MR data thereby obtaining signal-suppressed MR data; suppressing EMI in the signal-suppressed MR data to obtain EMI-suppressed MR data; and applying an inverse of the filter to the EMI-suppressed MR data to obtain the second subset of the MR data; generating an MR image using the second subset of the MR data; and outputting the generated MR image.

(21) A method for generating a magnetic resonance (MR) image by suppressing electromagnetic interference (EMI) in MR data obtained using at least one radio-frequency (RF) receive coil part of an MRI system, the suppressing for removing zipper line noise artefacts that would otherwise be visible in the MR image, the MRI system in communication with a computer comprising a processor, the method comprising: identifying, using the processor, a noisy subset of the MR data in which EMI is to be suppressed; applying, using the processor, a filter to the noisy subset of the MR data to suppress contribution of one or more MR signals to the noisy subset to obtain signal-suppressed MR data; suppressing, using the processor, EMI in the signal-suppressed MR data to obtain EMI-suppressed MR data; applying, using the processor, an inverse of the filter to the EMI-suppressed MR data to obtain a denoised subset of MR data in which EMI has been at least partially suppressed; and generating, using the processor, the MR image using the denoised subset of the MR data.

(22) The method of (21), further comprising obtaining the MR data using the at least one RF receive coil part of the MRI system.

(23) The method of any one of (21) or (22), wherein applying the filter to the noisy subset of the MR data comprises suppressing contribution of one or more spin echo MR signals to the noisy subset of the MR data.

(24) The method of any one of (21) through (23), wherein suppressing the EMI in the signal-suppressed MR data comprises using component decomposition to obtain the EMI-suppressed MR data.

(25) The method of any one of (21) through (24), wherein the noisy subset of the MR data comprises a plurality of data portions for a respective plurality of frequency or time bins, and wherein suppressing the EMI in the noisy subset of the MR data comprises: for each particular data portion in the plurality of data portions, applying the filter to the particular data portion to obtain a respective signal-suppressed MR data portion; suppressing EMI in the respective signal-suppressed MR data portion to obtain a respective EMI-suppressed MR data portion; and applying the inverse of the filter to the EMI-suppressed MR data portion.

(26) The method of any one of (21) through (25), wherein suppressing EMI in the respective signal-suppressed MR data portion comprises: determining a component decomposition of the respective signal-suppressed MR data portion; modifying the component decomposition by setting at least one singular value of the component decomposition to a predetermined value or by multiplying at least one singular value of the component decomposition by a predetermined weight; and obtaining the respective EMI-suppressed MR data portion using the modified component decomposition.

(27) The method of any one of (21) through (26), wherein at least one RF coils comprises multiple RF coils and wherein each data portion, of the plurality of data portions, comprises measurements for its respective frequency or time bin, of the plurality of frequency or time bins, made by each of the multiple RF coils.

(28) The method of any one of (21) through (27), wherein data in the respective signal-suppressed data portion is organized as an $N_c \times M$ matrix, where Ne is an integer representing the number of RF coils and M is an integer representing the number of measurements made by each of the RF coils, and wherein determining the component decomposition of the respective-signal suppressed MR data portion comprises determining a singular value decomposition of the $N_c \times M$ matrix.

(29) The method of any one of (21) through (28), further comprising: obtaining the MR data using the at least one RF receive coil part of the MRI system, while operating the MRI system in accordance with a spin echo or a gradient echo pulse sequence.

(30) The method of any one of (21) through (29), wherein the spin echo pulse sequence is selected from a group consisting of a T1 pulse sequence, a T2 pulse sequence, a fluid-attenuated inversion recovering (FLAIR) pulse sequence, and a diffusion weighted imaging (DWI) pulse sequence.

(31) The method of any one of (21) through (30), further comprising: after generating the MR data and before identifying the noisy subset, suppressing EMI in the MR data that is detected by an auxiliary RF coil of the MRI system.

(32) The method of any one of (21) through (31), wherein the EMI is narrowband EMI, and wherein the MR data comprises sensor domain data organized in a plurality of frequency or time bins, and wherein the EMI is present in a frequency or time bin of the plurality of frequency or time bins.

(33) The method of any one of (21) through (32), wherein the EMI is present in no more than a threshold number of neighboring frequency or time bins of the plurality of frequency or time bins.

(34) The method of any one of (21) through (33), wherein the EMI is present in an $n^{th}$ frequency or time bin of the plurality of frequency or time bins, and wherein applying the filter to the noisy subset of MR data comprises computing a weighted linear combination of data in multiple frequency or time bins, including the $n^{th}$ frequency or time bin, with the weights determined by coefficients of the filter.

(35) The method of any one of (21) through (34), wherein identifying the first subset of the MR data comprises identifying data in a single frequency or time bin or a set of neighboring frequency or time bins of the MR data that is affected by EMI.

(36) The method of any one of (21) through (35), wherein: the MR data comprises data in a plurality of frequency or time bins, the EMI is present in a plurality of neighboring frequency or time bins, and applying the filter to the noisy subset of the MR data comprises applying a convolutional filter having a length equal to at least a number of the neighboring frequency or time bins of the plurality of neighboring frequency or time bins.

(37) The method of any one of (21) through (36), wherein identifying the noisy subset of the MR data is performed by analyzing a portion of the MR data acquired during at least one predetermined echo signal of a pulse sequence used to acquire the MR data.

(38) The method of any one of (21) through (37), wherein identifying the noisy subset of the MR data comprises determining whether data in the one frequency or time bin or in the set of neighboring frequency or time bins has a magnitude greater than a threshold value.

(39) The method of any one of (21) through (38), wherein generating the MR image comprises: modifying the MR data by replacing the noisy subset of the MR data with the denoised subset of the MR data to obtain modified MR data; and generating the MR image using the modified MR data.

(40) A magnetic resonance imaging (MRI) system, comprising: a magnetics system having a plurality of magnetics components to produce magnetic fields for performing MRI by acquiring magnetic resonance (MR) data; and a processor configured to perform a method for generating an MR image by suppressing electromagnetic interference (EMI) in the MR data, the suppressing for removing zipper line noise artefacts that would otherwise be visible in the MR image: identifying, using the processor, a noisy subset of the MR data in which EMI is to be suppressed; applying, using the processor, a filter to the noisy subset of the MR data to suppress contribution of one or more MR signals to the noisy subset to obtain signal-suppressed MR data; suppressing, using the processor, EMI in the signal-suppressed MR data to obtain EMI-suppressed MR data; applying, using the processor, an inverse of the filter to the EMI-suppressed MR data to obtain a denoised subset of MR data in which EMI has been at least partially suppressed; and generating, using the processor, the MR image using the denoised subset of the MR data.

(41) At least one tangible computer readable storage medium storing processor-executable instructions that, when executed by a processor, cause the processor to perform a method for generating a magnetic resonance (MR) image by suppressing electromagnetic interference (EMI) in MR data obtained using at least one radio-frequency (RF) receive coil part of an MRI system, the suppressing for removing zipper line noise artefacts that would otherwise be visible in the MR image, the MRI system in communication with a computer comprising the processor, the method comprising: identifying, using the processor, a noisy subset of the MR data in which EMI is to be suppressed; applying, using the processor, a filter to the noisy subset of the MR data to suppress contribution of one or more MR signals to the noisy subset to obtain signal-suppressed MR data; suppressing, using the processor, EMI in the signal-suppressed MR data to obtain EMI-suppressed MR data; applying, using the processor, an inverse of the filter to the EMI-suppressed MR data to obtain a denoised subset of MR data in which EMI has been at least partially suppressed; and generating, using the processor, the MR image using the denoised subset of the MR data.

Having thus described several aspects and embodiments of the technology set forth in the disclosure, it is to be appreciated that various alterations, modifications, and improvements will readily occur to those skilled in the art. Such alterations, modifications, and improvements are intended to be within the spirit and scope of the technology described herein. For example, those of ordinary skill in the art will readily envision a variety of other means and/or structures for performing the function and/or obtaining the results and/or one or more of the advantages described herein, and each of such variations and/or modifications is deemed to be within the scope of the embodiments described herein. Those skilled in the art will recognize or be able to ascertain using no more than routine experimentation many equivalents to the specific embodiments described herein. It is, therefore, to be understood that the foregoing embodiments are presented by way of example only and that, within the scope of the appended claims and equivalents thereto, inventive embodiments may be practiced otherwise than as specifically described. In addition, any combination of two or more features, systems, articles, materials, kits, and/or methods described herein, if such features, systems, articles, materials, kits, and/or methods are not mutually inconsistent, is included within the scope of the present disclosure.

The above-described embodiments can be implemented in any of numerous ways. One or more aspects and embodiments of the present disclosure involving the performance of processes or methods may utilize program instructions executable by a device (e.g., a computer, a processor, or other device) to perform, or control performance of, the processes or methods. In this respect, various inventive concepts may be embodied as a computer readable storage medium (or multiple computer readable storage media) (e.g., a computer memory, one or more floppy discs, compact discs, optical discs, magnetic tapes, flash memories, circuit configurations in Field Programmable Gate Arrays or other semiconductor devices, or other tangible computer storage medium) encoded with one or more programs that, when executed on one or more computers or other processors, perform methods that implement one or more of the various embodiments described above. The computer readable medium or media can be transportable, such that the program or programs stored thereon can be loaded onto one or more different computers or other processors to implement various ones of the aspects described above. In some embodiments, computer readable media may be tangible (e.g., non-transitory) computer readable media. In some embodiments, the computer readable media may comprise a persistent memory.

The terms "program" or "software" are used herein in a generic sense to refer to any type of computer code or set of computer-executable instructions that can be employed to program a computer or other processor to implement various aspects as described above. Additionally, it should be appreciated that according to one aspect, one or more computer programs that when executed perform methods of the present disclosure need not reside on a single computer or processor but may be distributed in a modular fashion among a number of different computers or processors to implement various aspects of the present disclosure.

Computer-executable instructions may be in many forms, such as program modules, executed by one or more computers or other devices. Generally, program modules include routines, programs, objects, components, data structures, etc. that perform particular tasks or implement particular abstract data types. Typically, the functionality of the program modules may be combined or distributed as desired in various embodiments.

Also, data structures may be stored in computer-readable media in any suitable form. For simplicity of illustration, data structures may be shown to have fields that are related through location in the data structure. Such relationships may likewise be achieved by assigning storage for the fields with locations in a computer-readable medium that convey relationship between the fields. However, any suitable mechanism may be used to establish a relationship between information in fields of a data structure, including through the use of pointers, tags or other mechanisms that establish relationship between data elements.

When implemented in software, the software code can be executed on any suitable processor or collection of processors, whether provided in a single computer or distributed among multiple computers.

Further, it should be appreciated that a computer may be embodied in any of a number of forms, such as a rack-mounted computer, a desktop computer, a laptop computer, or a tablet computer, as non-limiting examples. Additionally, a computer may be embedded in a device not generally regarded as a computer but with suitable processing capabilities, including a Personal Digital Assistant (PDA), a smartphone, or any other suitable portable or fixed electronic device.

Also, a computer may have one or more input and output devices. These devices can be used, among other things, to present a user interface. Examples of output devices that can be used to provide a user interface include printers or display screens for visual presentation of output and speakers or other sound generating devices for audible presentation of output. Examples of input devices that can be used for a user interface include keyboards, and pointing devices, such as mice, touch pads, and digitizing tablets. As another example, a computer may receive input information through speech recognition or in other audible formats.

Such computers may be interconnected by one or more networks in any suitable form, including a local area network or a wide area network, such as an enterprise network, and intelligent network (IN) or the Internet. Such networks may be based on any suitable technology and may operate according to any suitable protocol and may include wireless networks, wired networks or fiber optic networks.

Also, as described, some aspects may be embodied as one or more methods. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B," when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively.

The terms "approximately" and "about" may be used to mean within ±20% of a target value in some embodiments, within ±10% of a target value in some embodiments, within ±5% of a target value in some embodiments, within ±2% of a target value in some embodiments. The terms "approximately" and "about" may include the target value.

The invention claimed is:

1. A method for suppressing electromagnetic interference (EMI) in magnetic resonance (MR) data obtained by a magnetic resonance imaging (MRI) system, the method comprising:
- using at least one computer hardware processor to perform:
  - identifying a first subset of the MR data that is affected by EMI;
  - suppressing EMI in the first subset of the MR data to obtain a second subset of the MR data by:
    - applying a filter to the first subset of the MR data in order to suppress contribution of MR spin echo signals in the first subset of the MR data thereby obtaining signal-suppressed MR data;
    - suppressing EMI in the signal-suppressed MR data to obtain EMI-suppressed MR data; and
    - applying an inverse of the filter to the EMI-suppressed MR data to obtain the second subset of the MR data;
  - generating an MR image using the second subset of the MR data; and
  - outputting the generated MR image.

2. The method of claim 1, wherein suppressing the EMI in the signal-suppressed MR data comprises:
- using component decomposition to obtain the EMI-suppressed MR data; or
- applying a domain transform to the signal-suppressed MR data,
- using component decomposition to obtain the EMI-suppressed MR data; and
- applying the inverse of the domain transform.

3. The method of claim 2, wherein the first subset of the MR data comprises a plurality of data portions for a respective plurality of frequency or time bins, and wherein suppressing the EMI in the first subset of the MR data comprises:
- for each particular data portion in the plurality of data portions,
  - applying the filter to the particular data portion to obtain a respective signal-suppressed MR data portion,
  - suppressing EMI in the respective signal-suppressed MR data portion to obtain a respective EMI-suppressed MR data portion; and
  - applying the inverse of the filter to the EMI-suppressed MR data portion.

4. The method of claim 3, wherein suppressing EMI in the respective signal-suppressed MR data portion comprises:
- determining a component decomposition of the respective signal-suppressed MR data portion,
- modifying the component decomposition by setting at least one component value of the component decomposition to a predetermined value or by multiplying at least one component value of the component decomposition by a predetermined weight; and
- obtaining the respective EMI-suppressed MR data portion using the modified component decomposition.

5. The method of claim 4,
- wherein the MRI system comprises multiple radio frequency (RF) coils, and
- wherein each data portion, of the plurality of data portions, comprises measurements for its respective frequency or time bin, of the plurality of frequency or time bins, made by each of the multiple RF coils.

6. The method of claim 5, wherein data in the respective signal-suppressed data portion is organized as an $N_c \times M$ matrix, where $N_c$ is an integer representing the number of RF coils and M represents one or more further dimensions of numbers of measurements made by each of the RF coils, and wherein determining the component decomposition of the respective-signal suppressed MR data portion comprises determining a singular value or higher-order singular value decomposition of the $N_c \times M$ matrix.

7. The method of claim 1, further comprising:

before identifying the first subset of the MR data, generating the MR data by operating the MRI system in accordance with a spin echo or a gradient echo pulse sequence.

8. The method of claim 7, further comprising:

after generating the MR data and before identifying the first subset, suppressing EMI in the MR data that is detected by an auxiliary coil of the MRI system.

9. The method of claim 1, wherein the EMI is narrowband EMI, and wherein the MR data comprises sensor domain data in a plurality of frequency or time bins, and wherein the EMI is present in a frequency or time bin of the plurality of frequency or time bins.

10. The method of claim 9, wherein the EMI is present in no more than a threshold number of neighboring frequency or time bins of the plurality of frequency or time bins.

11. The method of claim 9, wherein the EMI is present in an $n^{th}$ frequency or time bin of the plurality of frequency or time bins, and wherein applying the filter to the first subset of MR data comprises computing a weighted linear combination of data in multiple frequency or time bins, including the $n^{th}$ frequency or time bin, with the weights determined by coefficients of the filter.

12. The method of claim 1, wherein:

the MR data comprises data in a plurality of frequency or time bins, the EMI is present in a plurality of neighboring frequency or time bins, and applying the filter to the first subset of the MR data comprises applying a convolutional filter having a length equal to at least a number of the neighboring frequency or time bins of the plurality of neighboring frequency or time bins.

13. The method of claim 1, wherein identifying the first subset of the MR data comprises:

identifying data in a single frequency or time bin or a set of neighboring frequency or time bins of the MR data that is affected by EMI.

14. The method of claim 13, wherein identifying the first subset of the MR data is performed by:

analyzing a portion of the MR data acquired during at least one predetermined echo signal of a pulse sequence used to acquire the MR data: or determining whether data in the one frequency or time bin or in the set of neighboring frequency or time bins has a magnitude greater than a threshold value.

15. A magnetic resonance imaging (MRI) system, comprising:

a magnetics system having a plurality of magnetics components to produce magnetic fields for performing MRI by acquiring MR data; and at least one processor configured to perform:

identifying a first subset of the MR data that is affected by electromagnetic interference (EMI), suppressing EMI in the first subset of the MR data to obtain a second subset of the MR data by:

applying a filter to the first subset of the MR data in order to suppress contribution of MR spin echo signals in the first subset of the MR data thereby obtaining signal-suppressed MR data, suppressing EMI in the signal-suppressed MR data to obtain EMI-suppressed MR data; and applying an inverse of the filter to the EMI-suppressed MR data to obtain the second subset of the MR data; and generating an MR image using the second subset of the MR data; and outputting the generated MR image.

* * * * *